(12) United States Patent
Tanaka et al.

(10) Patent No.: US 8,248,857 B2
(45) Date of Patent: Aug. 21, 2012

(54) MEMORY SYSTEM WITH POTENTIAL RANK CORRECTION CAPABILITY

(75) Inventors: Hiroaki Tanaka, Hadano (JP); Tetsuya Murakami, Komae (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 262 days.

(21) Appl. No.: 12/644,685

(22) Filed: Dec. 22, 2009

(65) Prior Publication Data

US 2010/0254187 A1    Oct. 7, 2010

(30) Foreign Application Priority Data

Apr. 3, 2009   (JP) ................................ 2009-091242

(51) Int. Cl.
 G11C 11/34 (2006.01)
 G11C 16/04 (2006.01)
(52) U.S. Cl. .......... 365/185.24; 365/185.03; 365/185.09
(58) Field of Classification Search ............ 365/185.03, 365/185.09, 185.24, 210.11
 See application file for complete search history.

(56) References Cited

U.S. PATENT DOCUMENTS

| 5,909,499 | A | 6/1999 | Tanabe |
| 6,151,246 | A | 11/2000 | So et al. |
| 6,307,776 | B1 | 10/2001 | So et al. |
| 6,898,117 | B2 | 5/2005 | So et al. |
| 7,170,781 | B2 | 1/2007 | So et al. |
| 7,397,697 | B2 | 7/2008 | So et al. |
| 2008/0175054 | A1 * | 7/2008 | Hancock et al. ......... 365/185.09 |

FOREIGN PATENT DOCUMENTS

JP    11-154394    6/1999

OTHER PUBLICATIONS

U.S. Appl. No. 12/552,671, filed Sep. 2, 2009, Hiroaki Tanaka et al.

* cited by examiner

*Primary Examiner* — Hoai V Ho
*Assistant Examiner* — Kretelia Graham
(74) *Attorney, Agent, or Firm* — Oblon, Spivak, McClelland, Maier & Neustadt, L.L.P.

(57) ABSTRACT

A memory system includes a cell array including a plurality of nonvolatile memory cells electrically connected to a common word line, each memory cell storing a plurality of bits including a plurality of potential ranks, and a controller measuring a potential of the memory cell for each potential rank and changing a lower limit and upper limit of the potential rank based on the measurement result.

19 Claims, 18 Drawing Sheets

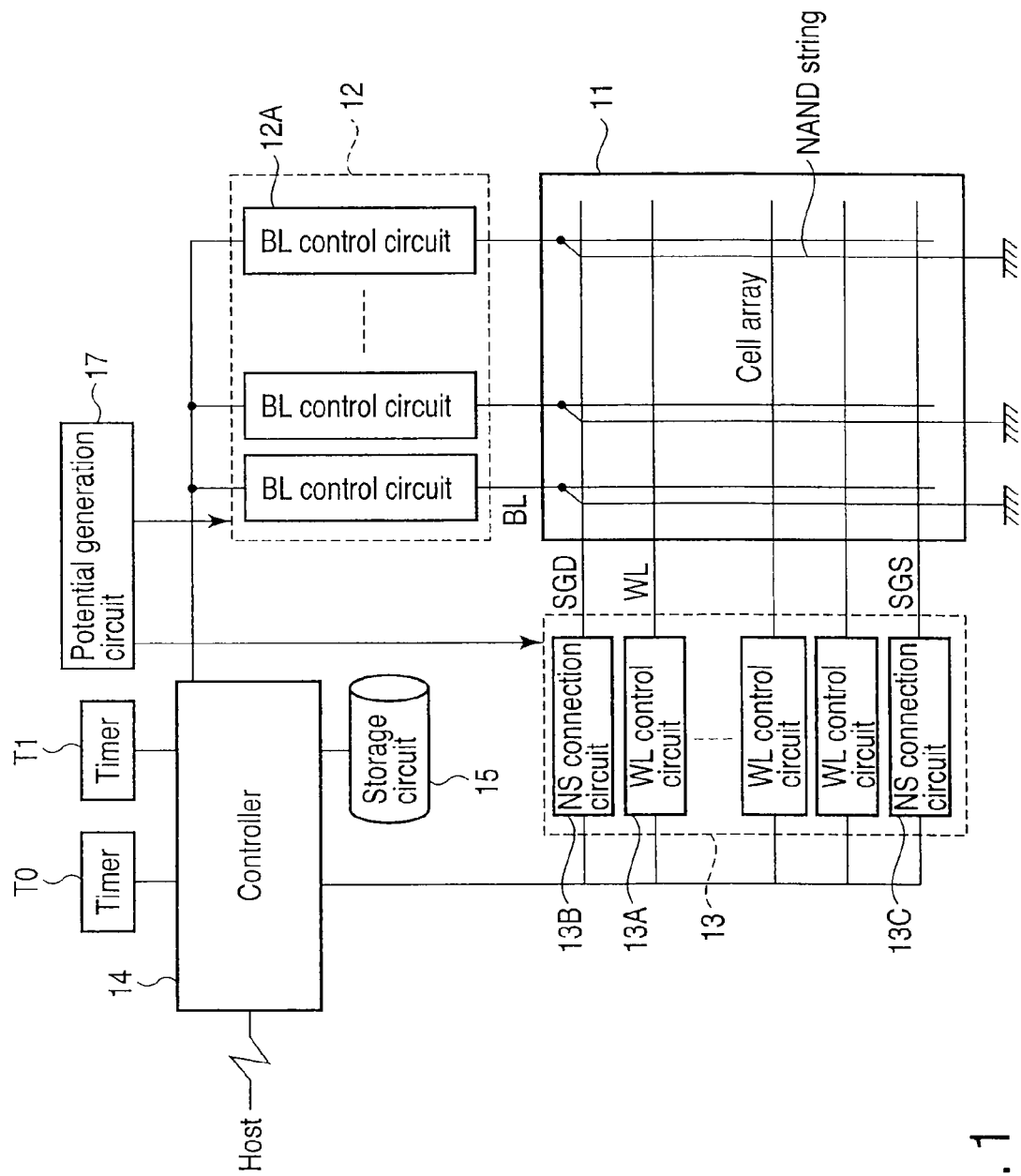
F I G. 1

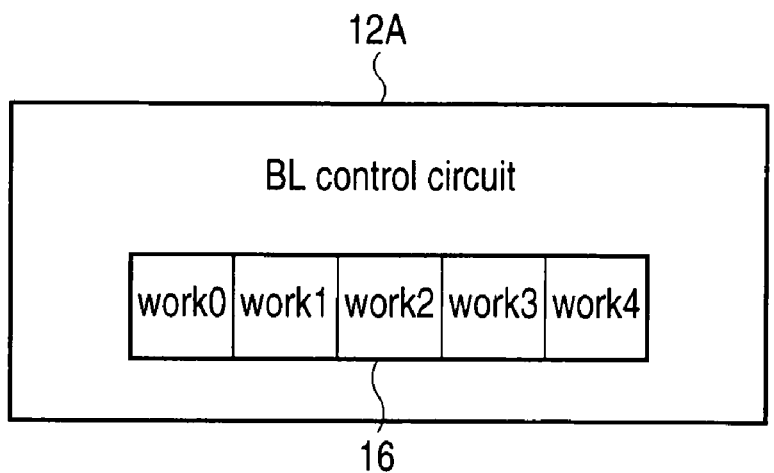
F I G. 4
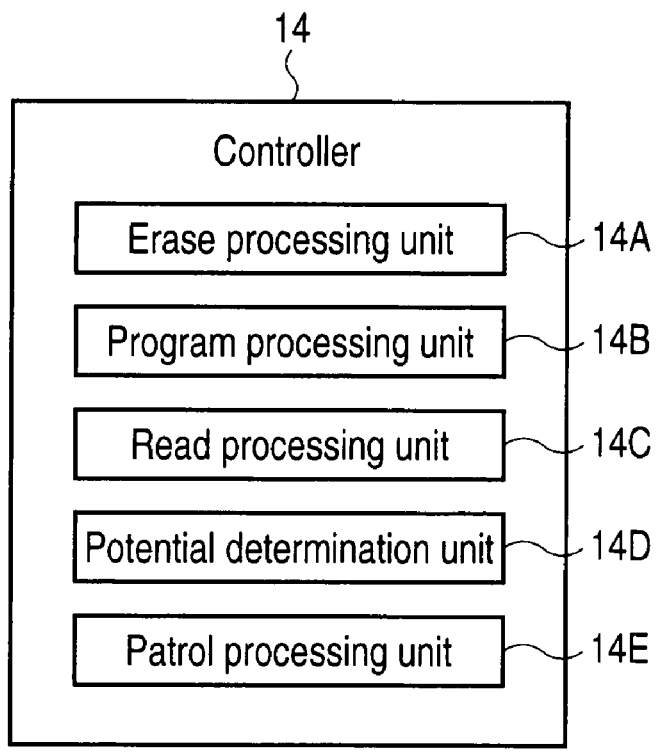
F I G. 5

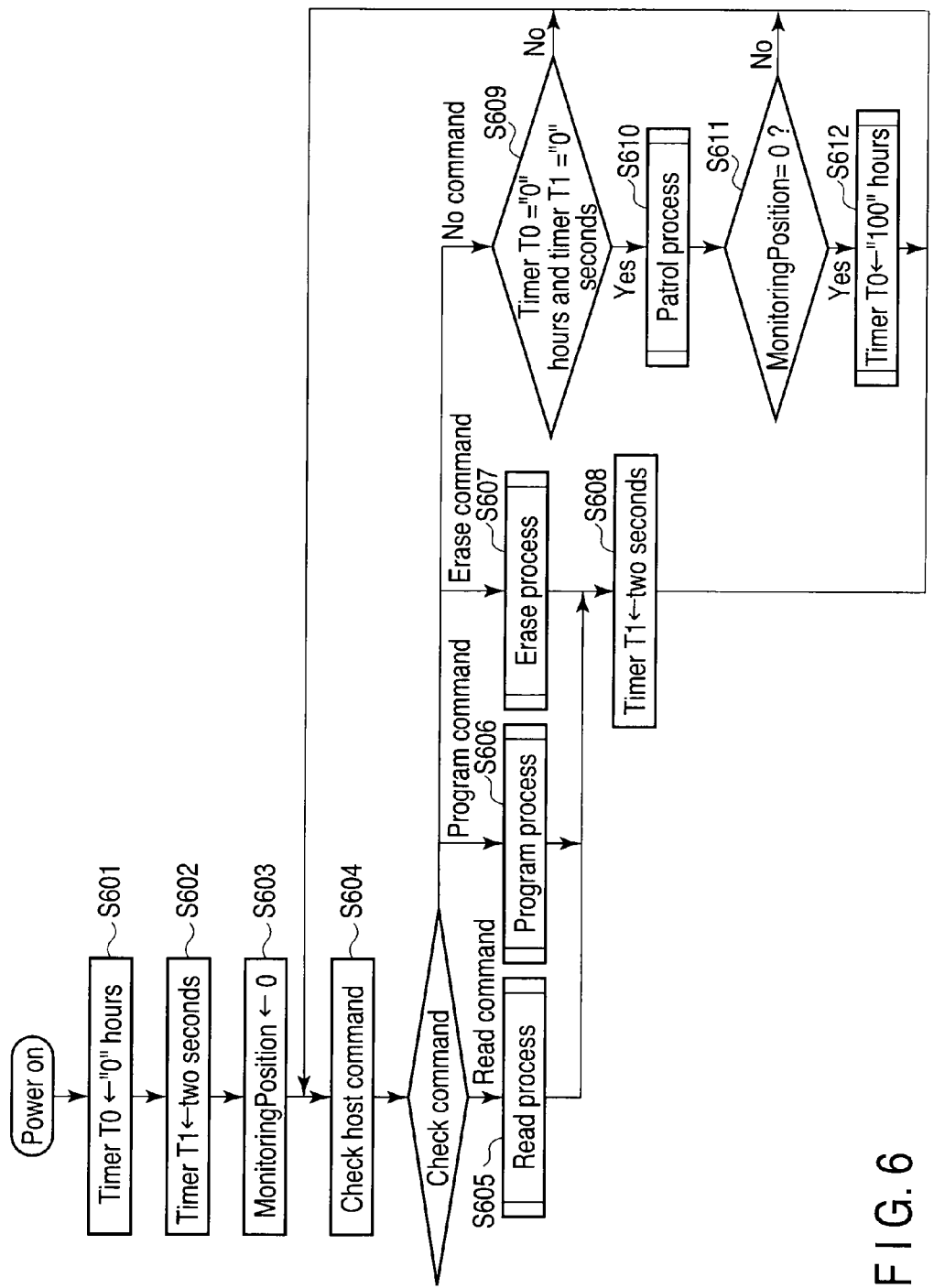
F I G. 6

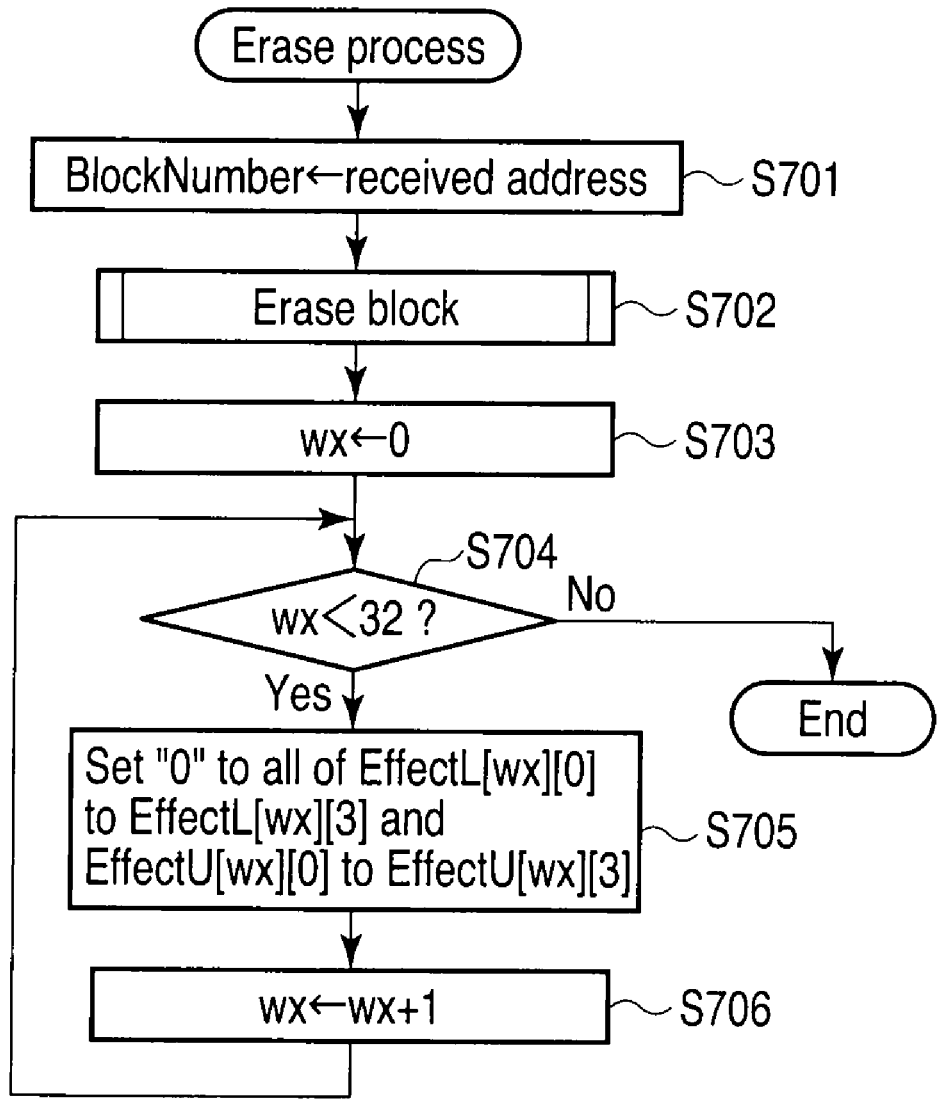
F I G. 7

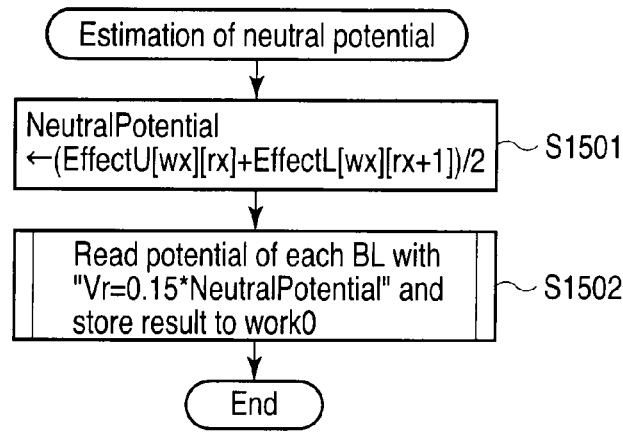
F I G. 1 5
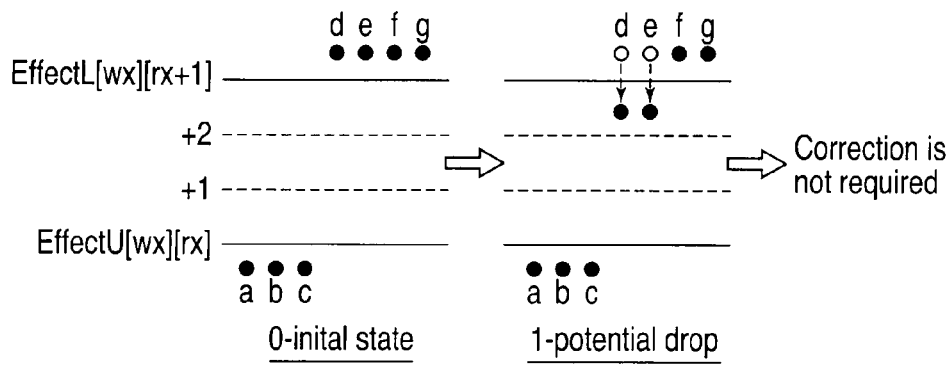
F I G. 1 8
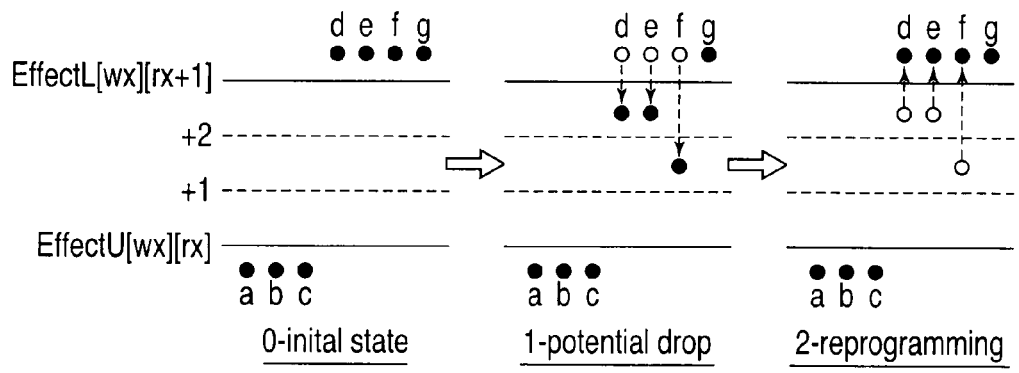
F I G. 1 9

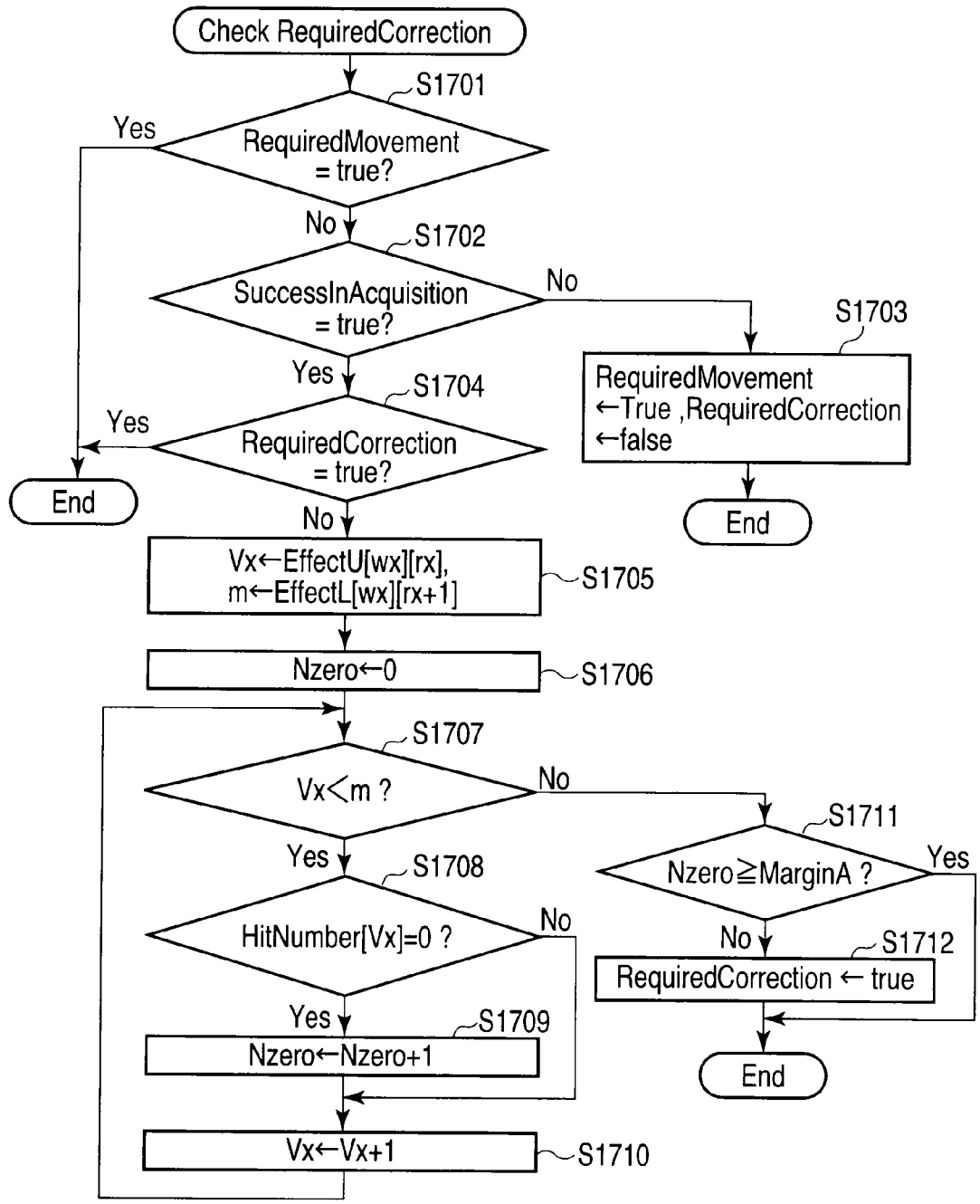
F I G. 17

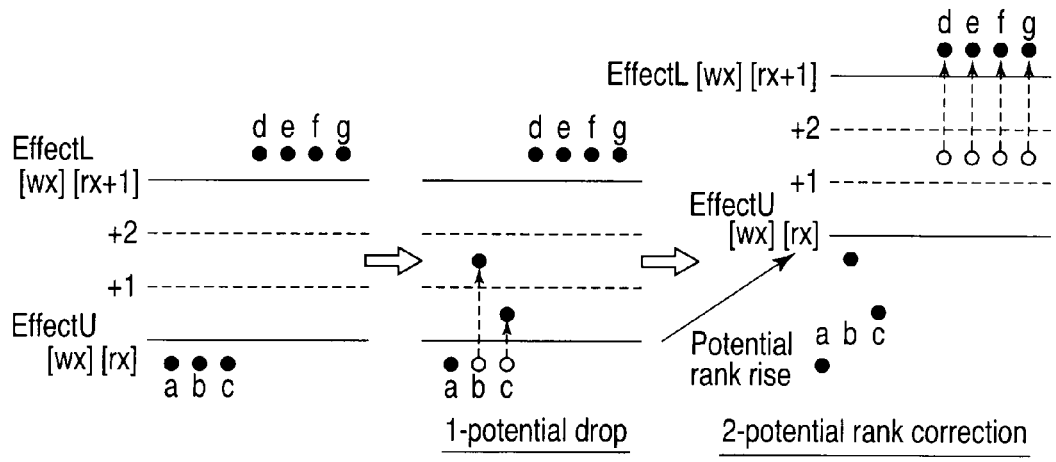
F I G. 20
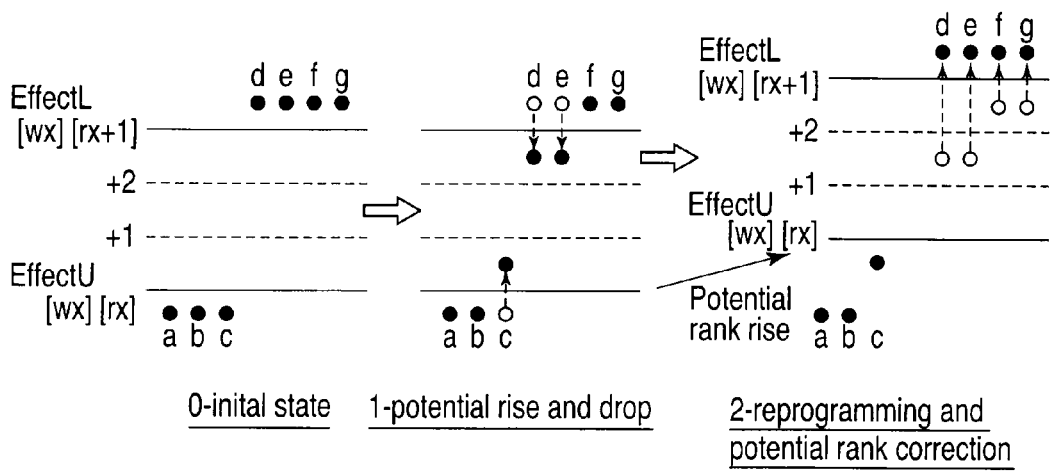
F I G. 21

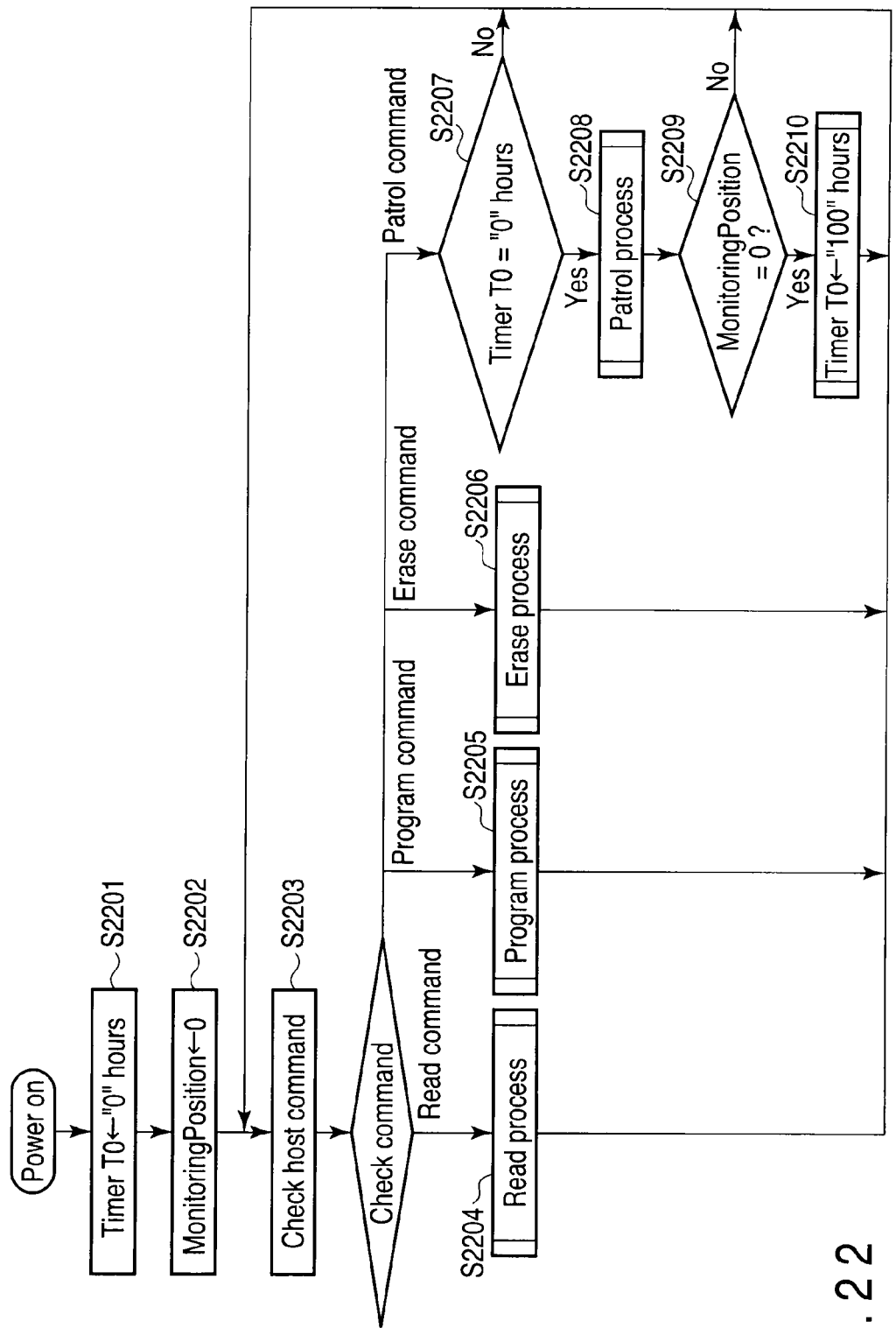
F I G. 22

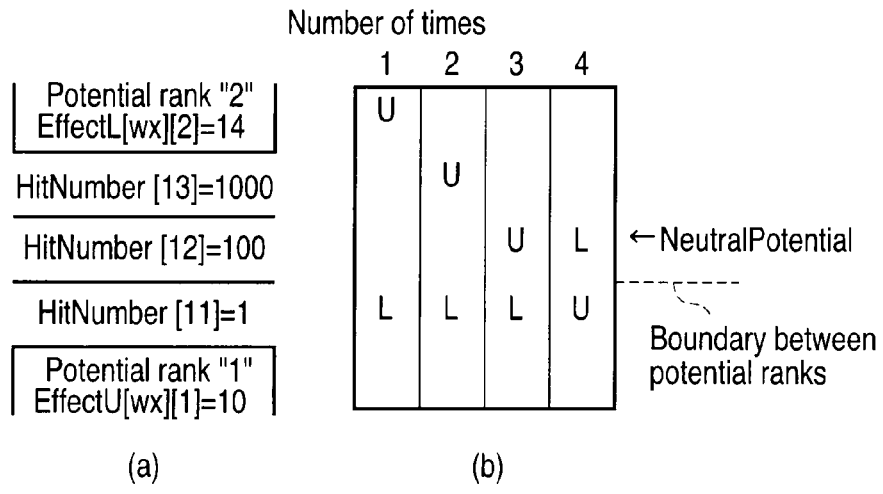
F I G. 2 4
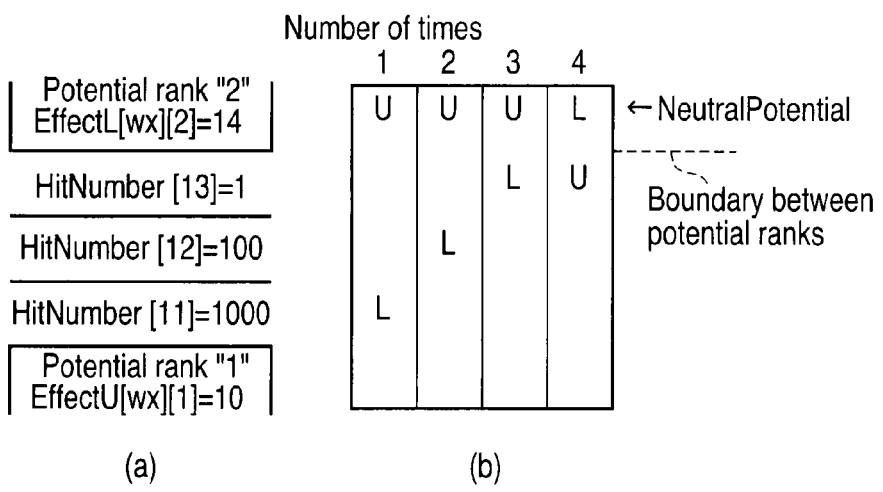
F I G. 2 5

MEMORY SYSTEM WITH POTENTIAL RANK CORRECTION CAPABILITY

CROSS-REFERENCE TO RELATED APPLICATIONS

This application is based upon and claims the benefit of priority from prior Japanese Patent Application No. 2009-091242, filed Apr. 3, 2009, the entire contents of which are incorporated herein by reference.

BACKGROUND OF THE INVENTION

1. Field of the Invention

This invention relates to a memory system and a control method thereof and more particularly to a memory system having an electrically rewritable flash memory.

2. Description of the Related Art

As one of electrically rewritable (reprogrammable) nonvolatile semiconductor memories, a NAND flash memory is known. In the NAND flash memory, information is recorded according to a potential of a control gate (that is hereinafter simply referred to as a potential of a cell) by changing the potential by injection of electrons when the channel of a recorded cell is changed from a cutoff state to a conductive state.

However, the cell potential is gradually lowered as charges are extracted from the floating gate when a long time has elapsed after recording. Then, if the potential becomes lower than the threshold value of the potential for determination of recording data, data is shifted to an adjacent threshold level. Further, the potentials of some cells may rise due to charges being introduced into the floating gate itself or an insulating layer surrounding the floating gate during the operation. Also, in this case, a threshold value between the effective potential width of data originally recorded in the cell and the effective potential width adjacent to the above effective potential width on the higher-potential side is exceeded and, as a result, data will be shifted. Since the above two phenomena are phenomena that can occur, it is necessary to prepare a mechanism that prevents data from being shifted even when one of the phenomena occurs.

Conventionally, a redundant area is provided in addition to a user area in which user data is recorded, and an error correction code or the like is recorded in the redundant area. Then, the above two data shifts are grasped as phenomena by use of the error correction code and a correct data string is obtained by correcting them. Further, user data is prevented from being lost by copying data of a block in which a data shift has occurred into another block. However, in order to make it possible to use a copy-source block in which the data shift has occurred again, it is necessary to erase the data. Since the erase operation reduces the life of the NAND flash memory, it is desirable to avoid the erase operation as far as possible.

As another method for coping with the above problem, a process for performing a program cycle again only for a cell to set the potential of a cell to a lower limit VFx as a target when the potential of the cell is lowered and becomes lower than VFx to which the cell potential should be set and temporarily copying user data into a buffer, erasing block data and writing back data from the buffer to the block when the cell potential exceeds an upper limit VAx to which the cell potential should be set, that is, the technique for refreshing, is disclosed in Jpn. Pat. Appln. KOKAI Publication No. H11-154394. However, even if this method is applied, a data reprogramming operation must be performed when the cell potential gradually rises, which is not desirable in suppressing the number of data reprogramming operations.

Further, in any one of the above techniques, since a fixed potential is used to determine a data rank to which the potential of a cell belongs, the potential rise or drop only has a margin that is substantially equal to half the potential rank range. Therefore, the determination cannot be made based on the characteristics of a flash memory in which the potential strongly tends to drop, therefore a flash memory in which the potential strongly tends to rise and a data shift will be caused in an early stage.

BRIEF SUMMARY OF THE INVENTION

According to an aspect of the present invention, there is provided a memory system comprising:

a cell array including a plurality of nonvolatile memory cells electrically connected to a common word line, each memory cell storing a plurality of bits including a plurality of potential ranks, and a controller measuring a potential of the memory cell for each potential rank and changing a lower limit and upper limit of the potential rank based on the measurement result.

According to an aspect of the present invention, there is provided a control method of a memory system that includes a cell array including a plurality of nonvolatile memory cells electrically connected to a common word line, each memory cell storing a plurality of bits including a plurality of potential ranks, the method comprising:

measuring a potential of the memory cell for each potential rank, and changing a lower limit and upper limit of the potential rank based on the measurement result.

BRIEF DESCRIPTION OF THE SEVERAL VIEWS OF THE DRAWING

FIG. 1 is a block diagram showing the configuration of a NAND flash ROM according to a first embodiment.

FIG. 4 is a schematic diagram showing the configuration of a work register 16 contained in a BL control circuit 12A.

FIG. 5 is a block diagram showing the configuration of a controller 14 shown in FIG. 1.

FIG. 6 is a flowchart for illustrating the whole operation of a NAND flash ROM.

FIG. 7 is a flowchart for illustrating an erase process of the NAND flash ROM.

FIG. 15 is a flowchart for illustrating a neutral potential estimation process of the NAND flash ROM.

FIG. 17 is a flowchart for illustrating a required-correction check process of the NAND flash ROM.

FIG. 18 is a diagram for illustrating the effect of the first embodiment.

FIG. 19 is a diagram for illustrating the effect of the first embodiment.

FIG. 20 is a diagram for illustrating the effect of the first embodiment.

FIG. 21 is a diagram for illustrating the effect of the first embodiment.

FIG. 22 is a flowchart for illustrating the whole operation of a NAND flash ROM according to a second embodiment.

FIG. 24 is a diagram for illustrating the effect of the third embodiment.

FIG. 25 is a diagram for illustrating the effect of the third embodiment.

DETAILED DESCRIPTION OF THE INVENTION

Figure 2:
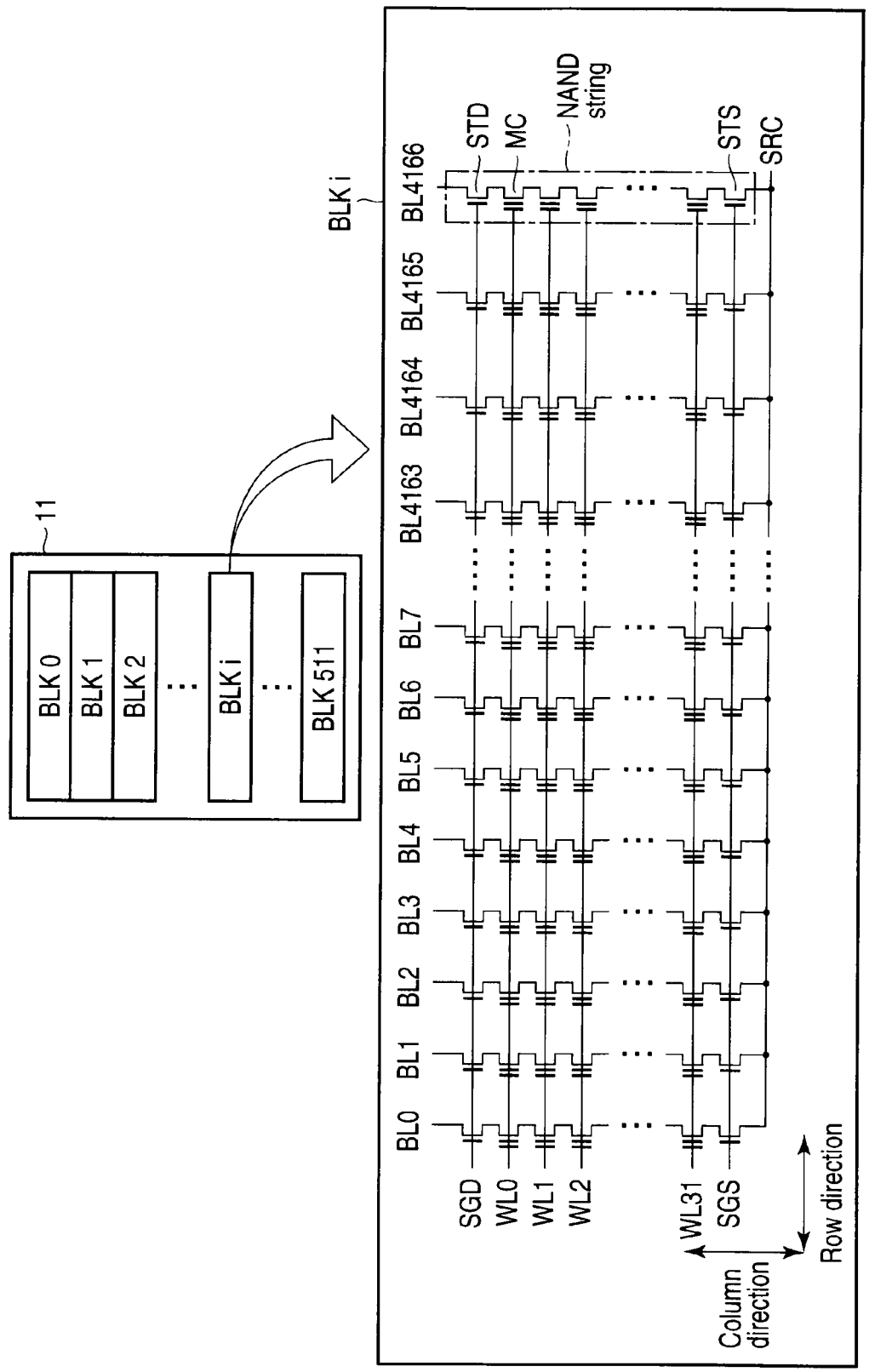
FIG. 2 is a circuit diagram showing the configuration of a cell array 11.

The embodiments of the present invention will be described hereinafter with reference to the accompanying drawings. In the description which follows, the same or functionally equivalent elements are denoted by the same reference numerals, to thereby simplify the description.

In embodiments of the present invention explained below, potentials of all of the cells contained in a NAND flash memory are sequentially checked at timings at which the read, write (program) and erase processes are not performed, and a potential range in which cells set in a state in which the potentials thereof deviate from a range of values corresponding to recording data items are not present is detected. Then, the potential of the range in which the above cell is not present is determined as a threshold value with respect to recording data and correct recording data and the rise and drop of the potential from the correct position of the cell are determined.

Further, a program is selectively executed with respect to a cell whose potential drops on the basis of correct recording data, and the threshold value is corrected to regard the range of potential of a cell whose potential rises on the basis of correct recording data as potential of new correct recording data. In order to acquire a potential margin used to correct the threshold value, the target potential is dynamically and gradually set from the low potential at the data programming time.

With the above techniques, a period in which data of the flash memory can be regarded as being correct can be made long and, as a result, the number of erase processes accompanied by movement of data can be suppressed. Next, the embodiment of this invention is explained with reference to the accompanying drawings. In the following explanation, elements having the same functions and configurations are denoted by the same symbols and repetitive explanations are made only when required.

First Embodiment

[1. Configuration of Memory System]

A memory system is a semiconductor storage device having a nonvolatile semiconductor memory. Specifically, the memory system is a NAND flash memory (that is hereinafter referred to as a NAND flash ROM) that is one type of an electrically erasable programmable read only memory (EEPROM) capable of electrically programming and erasing data.

The respective function blocks of each embodiment of this invention can be each realized by one of hardware, software and firmware or a desired combination of hardware, software and firmware. Therefore, each function block is explained below from the viewpoint of the function in order to clearly indicate the hardware, software, firmware or a combination thereof that realizes the above function block. Realization of the function as hardware, software or firmware is dependent on the concrete embodiments or design restrictions imposed on the whole system. Those skilled in the art can realize the above functions by use of various methods for respective concrete embodiments, and the methods used to realize such functions are included in the scope of this invention.

In this embodiment, a NAND flash ROM in which 2-bit information is recorded for each cell is treated as one example. Of course, the number of bits is not limited to two bits and this invention can be applied to a NAND flash ROM in which information of one bit or two or more values is stored. In this case, a more significant effect can be attained for a memory cell of two bits or more.

FIG. 1 is a block diagram showing the configuration of a NAND flash ROM according to a first embodiment of this invention. The NAND flash ROM includes a cell array 11 having NAND cells (memory cells) MC arranged in a matrix form.

FIG. 2 is a circuit diagram showing the configuration of the cell array 11. In the cell array 11, a plurality of word lines WL extending in a row direction and a plurality of bit lines BL extending in a column direction are arranged. For example, 512 sets are provided, with (4096+71) bit lines BL and 32 word lines WL set as one set. The 4096 bit lines BL are used for user data recording and the remaining 71 bit lines are used for error detection and correction.

All of the NAND cells arranged on the 32 word lines WL as a whole configure a block. Therefore, the NAND flash ROM has 512 blocks (BLK0 to BLK511).

Each block BLK has 4167 NAND strings corresponding in number to the bit lines BL. The drains of selection transistors STD respectively contained in the NAND strings are connected to the bit lines BL and the gates thereof are commonly connected to a selection gate line SGD. Further, the sources of selection transistors STS respectively contained in the NAND strings are commonly connected to a source line SRC and the gates thereof are commonly connected to a selection gate line SGS. The source line SRC is grounded.

In each NAND string, 32 cells MC corresponding in number to the word lines WL are arranged with the current paths thereof serially connected between the source of the selection transistor STD and the drain of the selection transistor STS. That is, the 32 cells MC are serially connected in the column direction with the diffusion region (source or drain region) commonly used by the two adjacent cells.

The control gates of the cells are sequentially connected to the word lines WL0 to WL31 in order from the cell MC that lies in a position closest to the drain side. Therefore, the drain of the cell MC that is connected to the word line WL0 is connected to the source of the selection transistor STD, and the source of the cell MC that is connected to the word line WL31 is connected to the drain of the selection transistor STS.

The word lines WL0 to WL31 commonly connect the control gates of the cells MC of the NAND strings in the block, respectively. That is, the control gates of the cells MC that lie on the same row in the block are connected to the same word line WL. The (4096+71) cells MC connected to the same word line WL are treated as one page and the data program and data read operations are performed for each page.

Further, the bit line BL commonly connects the drains of the selection transistors STD of the blocks. That is, the NAND strings lying on the same column in the 512 blocks are connected to the same bit line BL.

Figure 3:
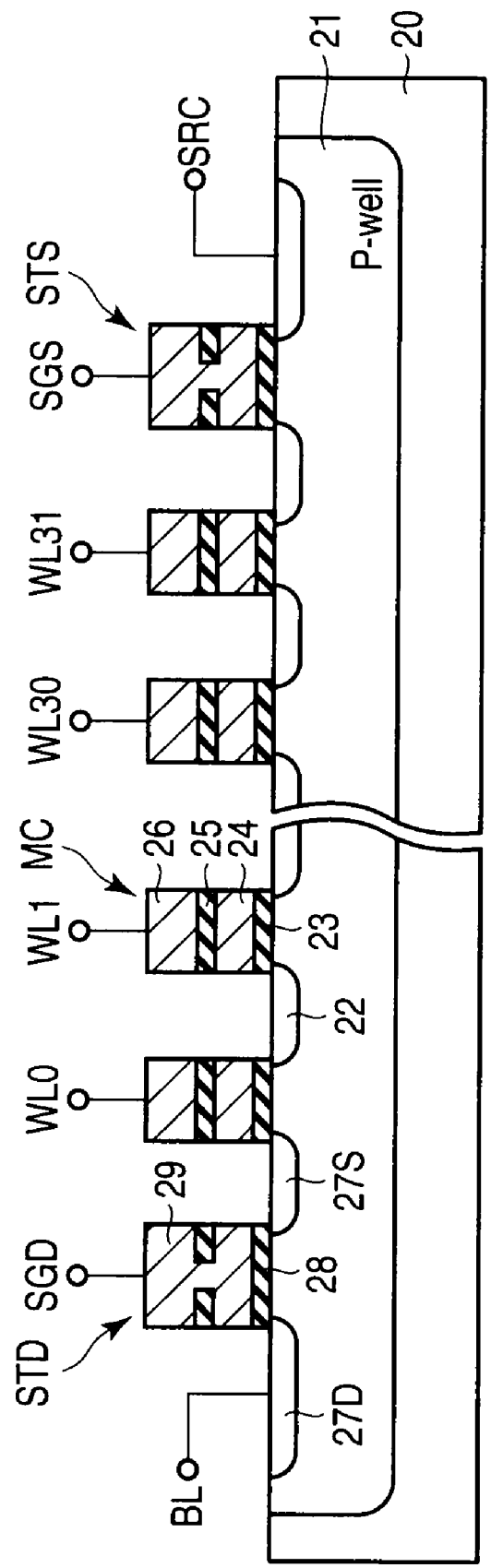
FIG. 3 is a cross-sectional view showing the structure of one NAND string.

FIG. 3 is a cross-sectional view showing the structure of one NAND string. In a semiconductor substrate 20, a P-type well (P-well) 21 is formed. Each cell MC is configured by a metal oxide semiconductor field effect transistor (MOSFET) having a stacked gate structure formed on the P-well 21. The stacked gate structure is configured by sequentially stacking a tunnel insulating film 23, floating gate electrode (floating gate) 24, gate-gate insulating film 25 and control gate electrode (control gate) 26 on the P-well 21. In a portion of the P-well 21 that lies between the adjacent stacked gate structures, a diffusion region (source region or drain region) 22 is formed.

The threshold voltage of the cell MC varies according to the number of charges stored in the floating gate 24 and the cell MC stores data according to a difference in the threshold voltage. As the type of the cell MC, a floating gate memory cell whose charge storage layer is formed of a conductive material of polysilicon, for example, or a metal-oxide-nitride-oxide-semiconductor (MONOS) memory cell whose charge storage layer is formed of an insulating film of a silicon nitride, for example, is possible. In the case of the MONOS memory cell, the gate-gate insulating film 25 is called a block insulating film.

The selection transistor STD is configured by a source region 27S and drain region 27D that are separately formed in the P-well 21, a gate insulating film 28 formed on a channel region between the source region 27S and drain region 27D and a gate electrode 29 formed on the gate insulating film 28. The selection transistor STS has the same structure.

As shown in FIG. 1, a BL controller 12 is connected to all of the bit lines BL. A WL controller 13 is connected to all of the word lines WL. Since the operation for the NAND flash ROM is performed for one word line WL (that is, one page) or one block set as one unit, a case wherein attention is paid to a particular block is explained in the following description. FIG. 1 shows the configuration of the BL controller 12 and WL controller 13 corresponding to one block.

The BL controller 12 has a plurality of BL control circuits 12A provided for the respective bit lines BL. The potential of the bit line BL is controlled by the BL control circuit 12A.

The WL controller 13 has a plurality of WL control circuits 13A provided for the respective word lines WL, an NS connection circuit 13B connected to the selection gate line SGD and an NS connection circuit 13C connected to the selection gate line SGS. The potential of the word line WL is controlled by the WL control circuit 13A. The channel of the NAND string is on/off-controlled by the NS connection circuits 13B and 13C.

Each of the BL control circuits 12A has a readable and writable work register 16. FIG. 4 is a schematic diagram showing the configuration of the work register 16 contained in the BL control circuit 12A. The work register 16 has a 5-bit storage region. Five bits of the work register 16 are respectively called work0, work1, work2, work3 and work4 and distinguished from one another. Since the NAND flash ROM has (4096+71) BL control circuits 12A as a whole, work0, work1, work2, work3 and work4 of (4096+71) are provided in total.

In the following explanation, not only work0 but also several work registers are explained, and a notational system attained by expanding a programming language notation is used to express the registers. In this case, work0[x] indicates a work register work0 of an X-th BL control circuit 12A. When one register of 2-bit length is formed by combining a plurality of registers, for example, work0 and work1, this is expressed as work01. If work01 is regarded as a numeric value, work0 has a higher value and work1 has a lower value. When all of the registers of work0 are simultaneously considered, this is expressed as work0[ ] by using a programming language array notation. Further, a two-dimensional array notation, for example, a notation of EffectL[wx][0] is used. This means that "EffectL" indicates a register having the array structure, a wx-th element "EffectL[wx]" is the array having several elements and "EffectL[wx][0]" indicates a 0th element.

The operations of the BL controller 12 and WL controller 13 are controlled by the controller 14. Further, the controller 14 controls communication with the host. In addition, the controller 14 is connected to a storage circuit 15. The storage circuit 15 is configured by a nonvolatile memory with a capacity smaller than that of the cell array 11. For example, a NOR flash memory is used as the storage circuit 15. Data recorded in the storage circuit 15 in a nonvolatile fashion is described later.

A potential generation circuit 17 generates various potentials required by the NAND flash ROM to perform a process. For this purpose, for example, the potential generation circuit 17 has a D/A converter that generates a constant voltage. Potentials generated by the potential generation circuit 17 are supplied to the BL controller 12, WL controller 13 and the like. The BL controller 12 sets the potential of the bit line BL by using the potential supplied from the potential generation circuit 17. The WL controller 13 sets the potential of the word line WL by using the potential supplied from the potential generation circuit 17.

FIG. 5 is a block diagram showing the configuration of the controller 14. The controller 14 includes an erase processing unit 14A, program processing unit 14B, read processing unit 14C, potential determination unit 14D and patrol processing unit 14E. The operations of the above units are explained in detail below with reference to the flowchart.

Next, the operation of the NAND flash ROM with the above configuration is explained with reference to the accompanying drawings.

[2. Whole Operation]

First, the operations performed by the controller 14 of the NAND flash ROM are explained. FIG. 6 is a flowchart for illustrating the operations of the NAND flash ROM (controller 14).

When the power source of the NAND flash ROM is turned on, the controller 14 performs an initialization operation. That is, the controller 14 sets a timer T0 and timer T1 to 0 and 2 seconds, respectively (steps S601, S602). The timer T0 and timer T1 are realized by down-counters. The down-counter has a property that the count is gradually reduced with time, and if the count reaches "0", the count is kept unchanged until a new value is set. Further, a variable MonitoringPosition is set to "0" (step S603). The variable MonitoringPosition indicates a word line WL to be monitored in the patrol process that will be described later.

Next, the controller 14 checks whether a command from the host is received or not (step S604). The process is branched as follows based on the result of the command check process.

If a read command is received from the host, the read process is performed (step S605).

If a program command is received from the host, the program process is performed (step S606).

If an erase command is received from the host, the erase process is performed (step S607).

If the above three processes are terminated, the controller 14 sets the timer T1 to two seconds, for example (step S608). The time set in the timer T1 is the idle time for determining an idle state of the NAND flash ROM and can be freely set according to the specification of the NAND flash ROM. The timer T1 does not reach "0" if any command is received from the host within a period of two seconds. If the timer T1 is kept at "0", it indicates that a period in which no command is received from the host continues.

If no command is received from the host, the controller 14 checks the timer T0 and timer T1 (step S609). Then, if both of the timers are set to "0", it performs the patrol process (step S610). If at least one of the timer T0 and timer T1 is not set at "0", it instantly returns the process to step S604 of the host command check process without performing the patrol process.

When the patrol process is terminated, the controller 14 checks the MonitoringPosition at this time (step S611) and sets the timer T0 to, for example, 100 hours (step S612) if the MonitoringPosition is set at "0". The MonitoringPosition of "0" indicates that the patrol process is performed for all of the word lines by one cycle and if the patrol process is performed once for all of the word lines (unless the power source is turned off after this), a period of 100 hours is set before starting the next patrol process to prevent the patrol process from being frequently performed. The time set in the timer T0 is set according to the charge holding characteristic of the cell MC.

When data is written in the NAND flash ROM, the host first performs an erase process for a block to be written and then performs a write process for a page to be recorded. At this time, the record process is performed to satisfy the restriction on the order of recording pages in step S804, which will be described later.

[3. Erase Process]

Next, the erase process performed by the controller 14 of the NAND flash ROM is explained. FIG. 7 is a flowchart for illustrating the erase process of the NAND flash ROM (erase processing unit 14A).

In the erase process, an address specification is received from the host in order to specify one of the to-be-erased blocks of the NAND flash ROM and set as a variable BlockNumber (step S701). The NAND flash ROM erases a block corresponding to the address specification (step S702). The process is the same as the erase process conventionally performed.

Subsequently, variables EffectL and EffectU related to the block are all set to "0". The two variables EffectL and EffectU are set in the 2 dimensional array and respective elements correspond to the word lines WL0 to WL31 in the block and each element includes four elements "0" to "3" corresponding to the number of recording data items (in this embodiment, two bits, that is, four values). The elements are provided for each block. The two variables EffectL and EffectU are stored in the storage circuit 15.

Specifically, the erase processing unit 14A sets the variable wx corresponding to the number of the word line to "0" (step S703). Then, it sets all of EffectL[wx][0] to EffectL[wx][3] and EffectU[wx][0] to EffectU[wx][3] to "0" (step S705). The variables EffectL and EffectU are set to "0" until the variable wx reaches "32" (step S704) while increasing the variable wx one by one (step S706).

In this embodiment, the variables EffectL and EffectU are set after data is programmed in the cell. Therefore, if data of the block is erased, the values of the variables EffectL and EffectU are also cleared at this time.

[4. Program Process]

Figure 8:
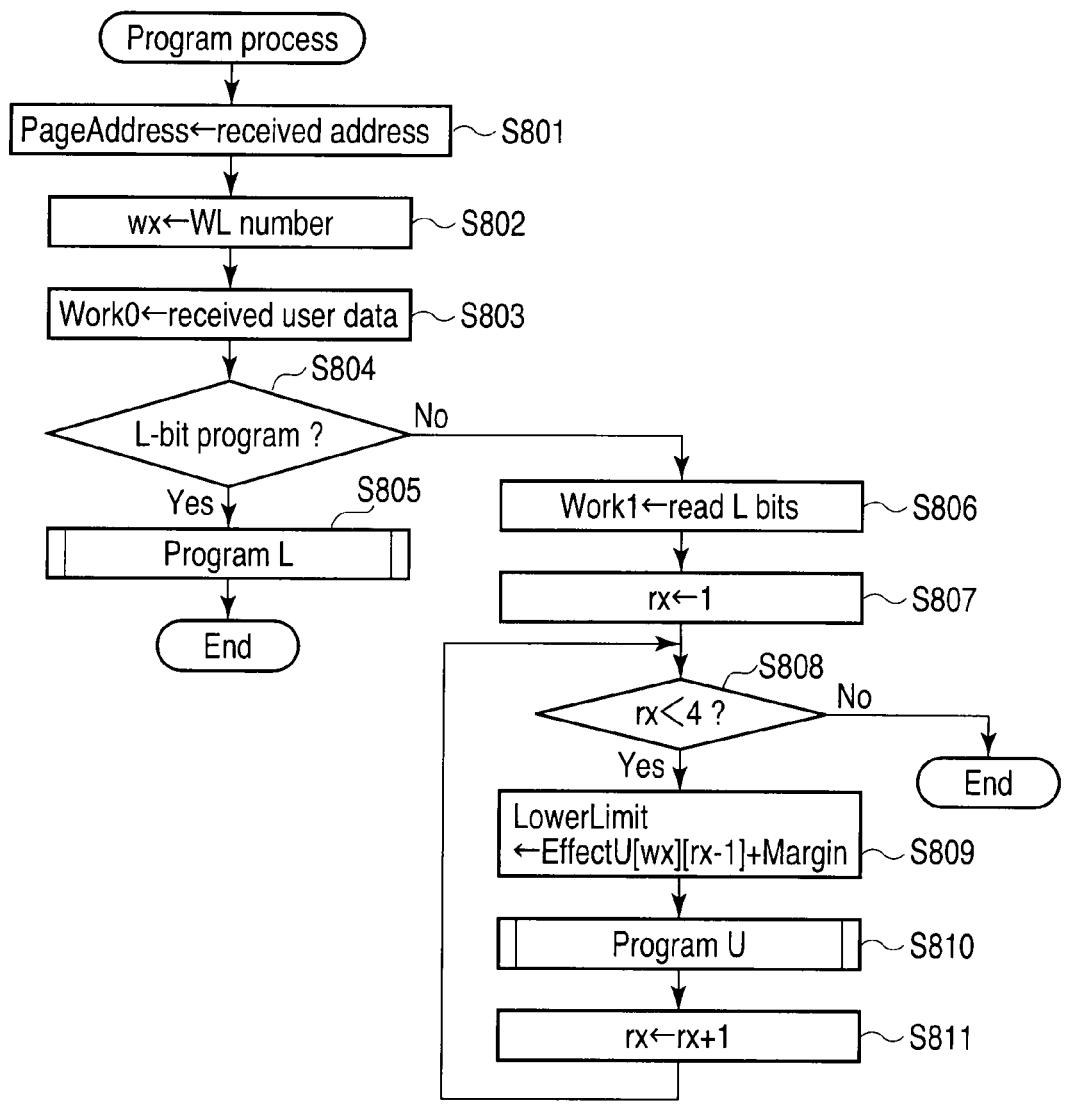
FIG. 8 is a flowchart for illustrating a program process of the NAND flash ROM.

Next, the write (program) process performed by the controller 14 of the NAND flash ROM is explained. FIG. 8 is a flowchart for illustrating the program process of the NAND flash ROM (program processing unit 14B).

The program processing unit 14B receives an address of a page to be written from the host and stores the received address as the variable PageAddress (step S801). The page is a write unit of one cycle for the flash ROM and has (4096+71) bits in this embodiment.

Figure 9:
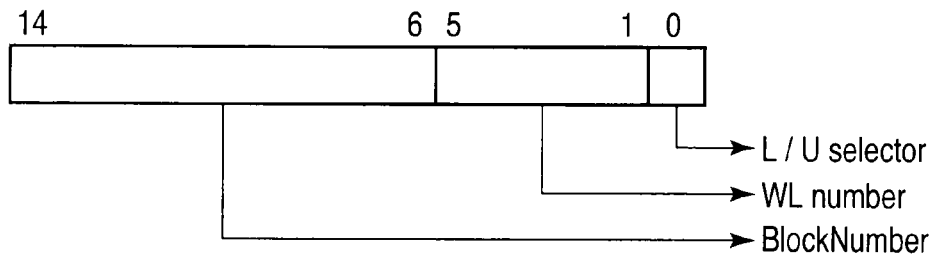
FIG. 9 is a schematic diagram showing the contents of a page address.

FIG. 9 is a schematic diagram showing the contents of the page address. For example, the page address is a 15-bit address and is sequentially divided into a 9-bit BlockNumber, 5-bit WL number and 1-bit L/U selector in an order from the upper address. The BlockNumber is used to select a block to be processed by the controller 14 of the flash ROM. The L/U selector indicates a program of one of the lower bit (L bit) and upper bit (U bit) in 2-bit data that can be recorded in the cell. The WL number in the page address is stored as the variable wx (step S802).

Subsequently, the program processing unit 14B receives user data from the host and stores the same in the work register work0 (step S803). Then, it determines whether the present page is an L-bit program or U-bit program (step S804). If the L/U selector of the page address is "0", the present page is an L-bit program and if it is "1", the present page is a U-bit program.

Concerning the write process for one cell in the write system used in this embodiment, plural bits that can be recorded in the cell are recorded from the lower bit towards the upper bit. At this time, if the highest cell potential that is suitable for recording data is Vmax, the cell potential is roughly kept at an erase level or raised to approximately Vmax/2 when the least significant bit is recorded. Then, when an upper bit is recorded, the cell potential is kept at the level or raised by Vmax/4. Thus a large cell potential variation is initially made. Subsequently, in order to suppress a variation in a threshold value due to the coupling effect between adjacent cells, a restriction that recording for a lower bit of another word line WL adjacent to the word line WL must be terminated prior to recording for an upper bit is provided. However, the above restriction must be considered on the host side that uses the flash ROM, and the NAND flash ROM performs a program operation according to an instruction from the host indicating whether it is the lower-bit (L-bit) program or upper-bit (U-bit) program.

The process for writing data to the NAND flash ROM is performed by changing the potential of the floating gate, but the potential cannot be directly recognized from the exterior. Instead, the potential is recognized according to the level of voltage applied to the control gate required for canceling the potential of the floating gate and changing the channel from the cutoff state to the conductive state. Therefore, the cell potential in the following explanation indicates the potential of the control gate required for changing the channel to the conductive state.

At the L-bit program time, the program processing unit 14B executes the program L (step S805). On the other hand, at the U-bit program time, the program processing unit 14B reads data of the word line WL specified by the variable wx by use of the threshold value 0V and the result is stored in the work register work1 (step S806). Specifically, the BL control circuit 12A precharges the bit line to a preset voltage at the data read time. At this time, the WL control circuit 13A applies a read potential, i.e., threshold voltage 0V in this case, to a word line to be read, and applies a read pass potential that turns on the cell irrespective of storage information to word lines other than the word line to be read. Then, the BL control circuit 12A reads information stored in the to-be-read cell according to whether the bit line potential is discharged or not. Data recorded in work1 is data that is already recorded in the word line WL by an L-bit program executed in advance. The relation between the cell potential in step S806 and a value stored in work1 is set to "1" when the cell potential does not reach the threshold value (when the cell is turned on) and is set to "0" when it exceeds the threshold value (when the cell is turned off).

Next, the program processing unit 14B sets the variable rx to "1" (step S807). While the variable rx is less than "4", the process after step S808 is repeatedly performed.

The program processing unit 14B calculates a value obtained by adding a variable Margin to the upper limit "EffectU[wx][rx−1]" of a potential rank that is lower by one rank, i.e., "EffectU[wx][rx−1]+Margin" and substitutes the value into a variable LowerLimit (step S809). The range that is not lower than the EffectL[wx][rx] and is lower than the EffectU[wx][rx] is called an rx-th potential rank. This is a value indicating that it is desirable to set the cell potential indicating specified data in a range between the above two potentials. The potential rank rx has a potential width having the lower limit set to the EffectL[wx][rx] and the upper limit set to the EffectU[wx][rx].

A potential rank corresponding to data 11b is a potential rank "0". In this case, "b" indicates a binary number. Since the cell potential after erasing is used as it is, the actual cell potential is a negative value, but in this case, the lower limit and upper limit are set to "0" as is set in the erase process. The other potential ranks "1" to "3" are sequentially arranged in a positive potential direction with gaps of variables Margins set from the potential rank "0" so that the regions do not overlap each other. The variable Margin is the designed width of the potential between the two adjacent potential ranks. In this embodiment, the variable Margin is "3". The cell potential including the variable Margin and handled by the controller 14 is set in the unit of resolution of potential that can be set by the WL controller 13. In this embodiment, 0.15V is set for each set value "1". Therefore, the variable Margin is actually set to 0.45V.

Next, the program processing unit 14B executes a program U (step S810). Then, it increases the variable rx by "1" (step S811) and returns the process to the step S808. The variable rx functions as a counter for selecting a potential rank. When rx=4 is attained, setting of the cell potentials to all of the potential ranks is completed and the program process is terminated.

Although not clearly shown in FIG. 8, the program L and program U may report occurrence of abnormality at the returning step. In this case, this is reported to the host. When the U-bit program is erroneously terminated, the upper bit of the word line WL remains in work0 and the lower bit remains in work1. The host issues a different command that is not described in this embodiment to acquire the data items, adequately corrects them and writes the data items in adequate positions of the NAND flash ROM.

[4-1. Program L]

Figure 10:
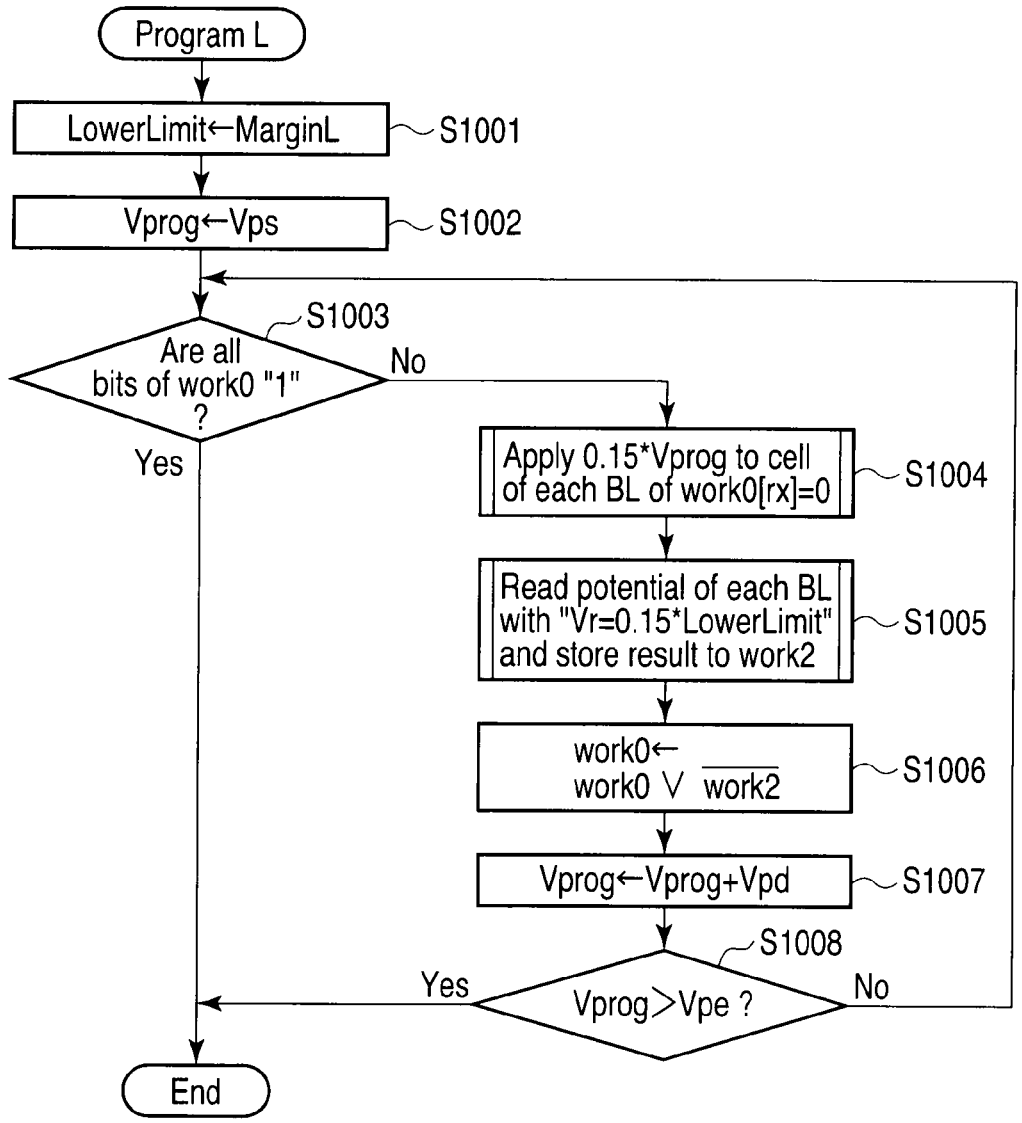
FIG. 10 is a flowchart for illustrating a lower-bit program process of the NAND flash ROM.

Next, the process for the lower-bit program (program L) performed by the controller 14 of the NAND flash ROM is explained. FIG. 10 is a flowchart for illustrating the process for the program L of the NAND flash ROM (program processing unit 14B).

First, the program processing unit 14B sets the variable LowerLimit to a variable MarginL (step S1001). This value is used for rough potential setting to record lower data "0" to a cell and is set to a value slightly smaller than the lower limit of the designed potential rank with respect to data "00" at the time when the program U is terminated. In this embodiment, the variable MarginL is "9" (approximately 1.35V in terms of potential).

Subsequently, Vps is substituted into the variable Vprog (step S1002). The program potential Vprog is a program potential (record pulse) to be set on WL. The program start potential Vps is a program potential first set at the program start time. In this embodiment, the program start potential Vps is "106" (approximately 16V in terms of potential).

Subsequently, whether all of the bits of the work register work0[ ] are set to "1" or not is checked (step S1003). In the program L, data "1" is assigned to the erase level and data "0" is assigned to the potential rank indicated by the variable LowerLimit. Therefore, when step S1003 is first reached, whether a cell to which data "0" is written is present or not is checked. When step S1003 is reached in the second or succeeding cycle, whether or not a cell that must be programmed is still present at the time is checked in step S1003 since the value of work0 corresponding to the cell that is already programmed is sequentially changed to "1".

When the program processing unit 14B acquires information that all of the bits of work0 are "1", it terminates the process of the program L. If a bit having a value of "0" remains in work0, the process after step S1004 is performed.

The program processing unit 14B applies a program potential of 0.15 (V)*Vprog to cells of each BL with work0[rx]=0 (step S1004). In this case, "*" indicates a multiplication symbol. That is, the BL control circuit 12A sets the potential of a bit line to be written (that is, the potential of a channel region) to the ground potential Vss and sets the potentials of bit lines other than the to-be-written object to a floating state after the potentials are temporarily raised to power source potential Vdd. Then, the WL control circuit 13A applies the record pulse to the to-be-written word line and applies a write pass potential sufficiently lower than the record pulse to the word lines other than the to-be-written object. As a result, charges are injected only into the floating gate of the to-be-written cell.

Subsequently, the program processing unit 14B sets a read potential Vr to 0.15 (V)*LowerLimit, reads potentials of respective cells on the word line corresponding to the variable wx and stores the result to work2 (step S1005). This operation is simultaneously performed for all of the cells connected to one word line. The value of work2 corresponding to the cell whose potential is determined to exceed the read potential Vr, that is, the cell that is turned off by the read potential Vr is set to "0". Further, the value of work2 corresponding to the cell whose potential is determined not to exceed the read potential Vr, that is, the cell that is turned on by the read potential Vr is set to "1".

Subsequently, the program processing unit 14B replaces each bit of work0 by a value obtained by calculating "work0 V ¬work2" (step S1006). In this case, "V" indicates the operation of calculating the logical sum and "¬" indicates the bit inversion operation. The operation is simultaneously performed for all of the bits of work0 and work2 corresponding to BL. By this operation, work0 of the cell in which the L-bit program is completed is set to "1" and work0 of the cell in which the L-bit program is not completed is set to "0".

Then, the program processing unit 14B increases the program potential Vprog by difference potential Vpd (step S1007). As a result, by repeatedly performing the operation along the loop, the level of the record pulse is gradually raised each time. In this embodiment, the difference potential Vpd is "1".

Next, the program processing unit 14B checks whether or not Vprog exceeds the program potential upper limit Vpe (step S1008). In this embodiment, Vpe is set to "147" (approximately 22V in terms of potential). If it exceeds the upper limit, it indicates that the cell potential cannot be set to the target potential, and therefore, the occurrence of abnormality is notified to the calling source and the program process is terminated. If not, the process returns to step S1003 and the process after the checking process for work0 is repeatedly performed.

[4-2. Program U]

Figure 11:
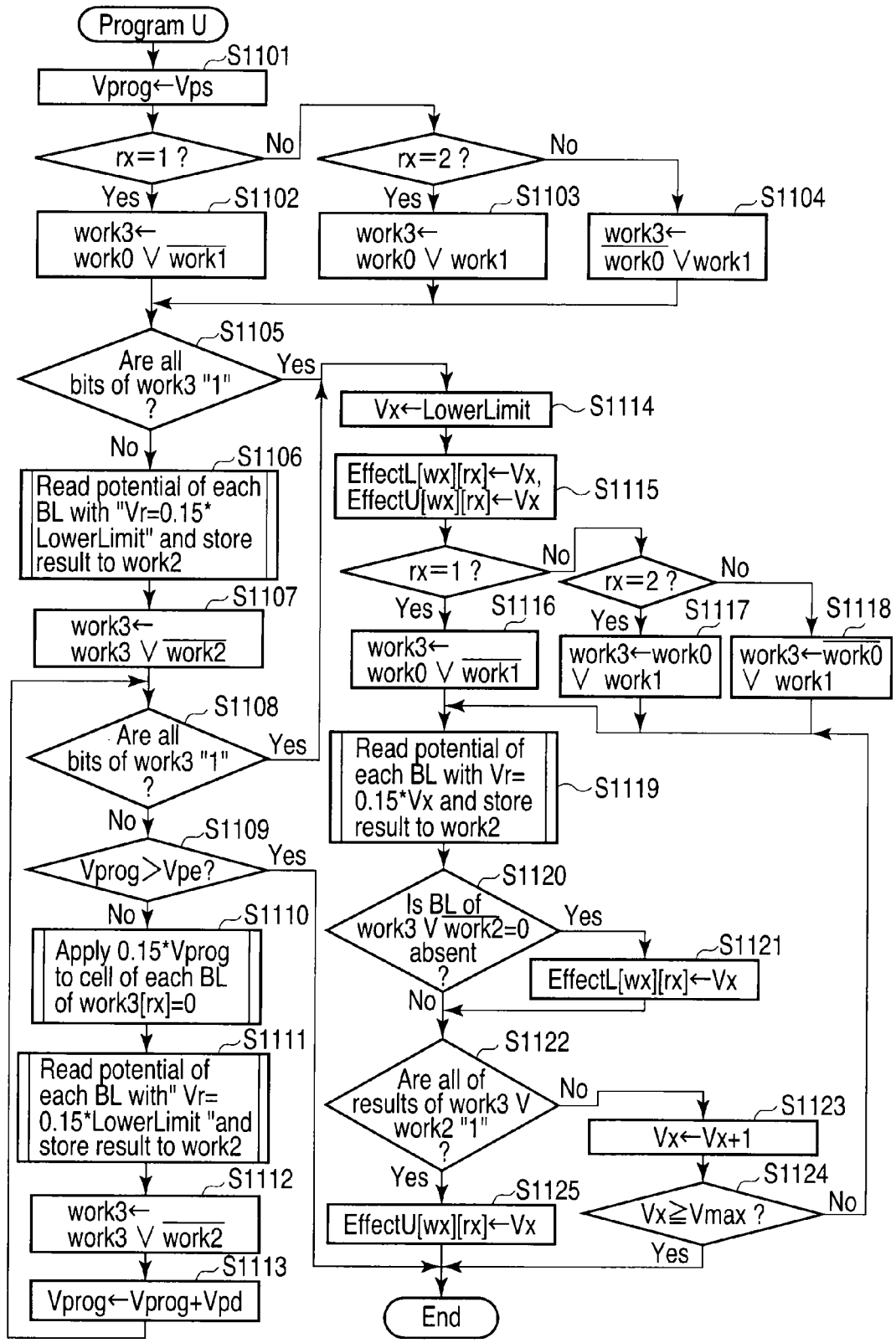
FIG. 11 is a flowchart for illustrating an upper-bit program process of the NAND flash ROM.

Next, the process for the upper-bit program (program U) performed by the controller 14 of the NAND flash ROM is explained. FIG. 11 is a flowchart for illustrating the process for the program U of the NAND flash ROM (program processing unit 14B).

Figures 12, 13:
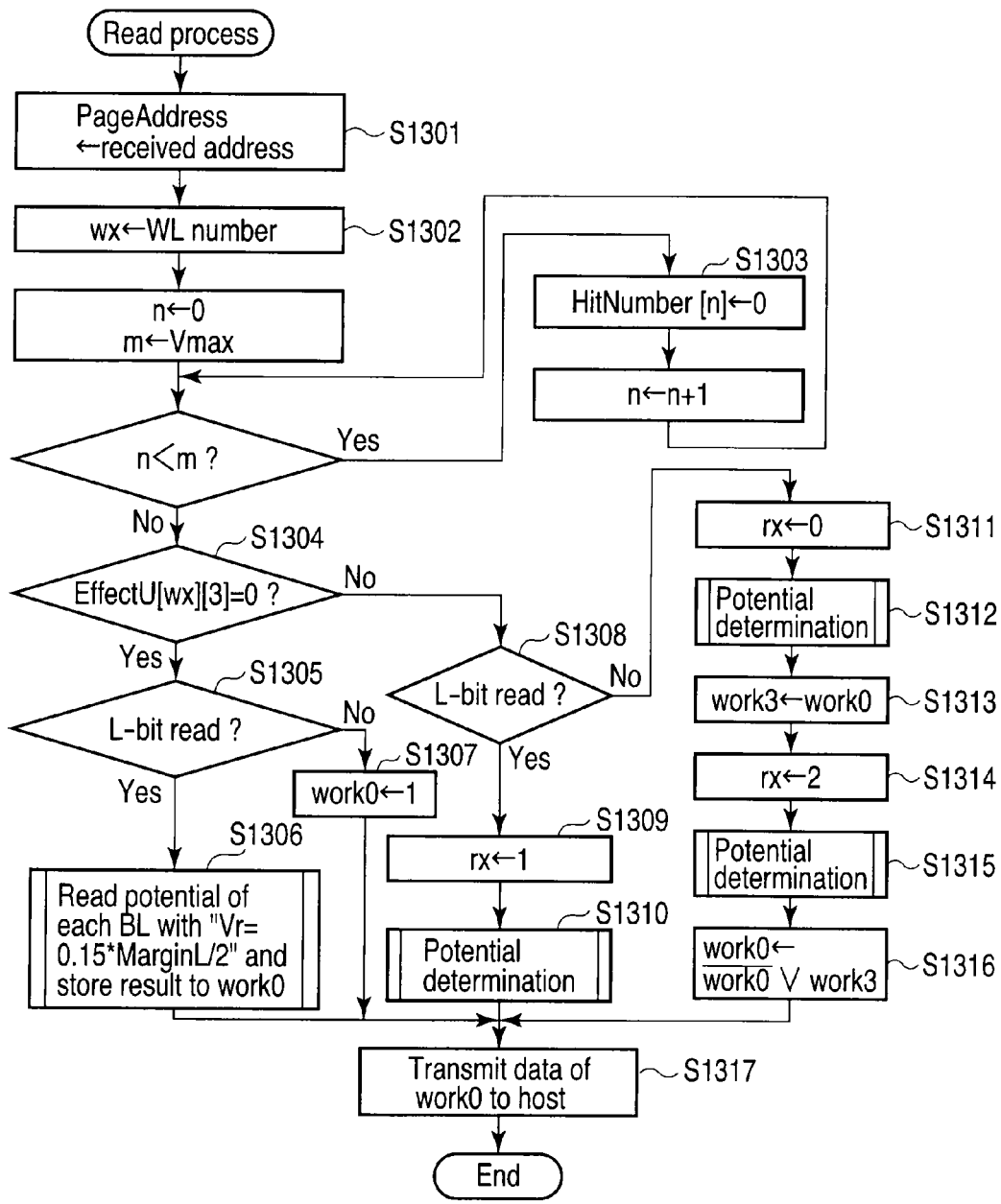
FIG. 12 is a diagram showing the relation between a potential rank and corresponding data.
FIG. 13 is a flowchart for illustrating a read process of the NAND flash ROM.

In the program U, a state in which the variable rx, LowerLimit and work registers work0, work1 are specified is set at the execution time thereof. The variable LowerLimit indicates that the potential rank must be set not to be lower than the potential indicated by the LowerLimit in order to record data with a sufficiently large margin with respect to a potential rank lower by one rank. The variable rx indicates the number of a potential rank. Numbers are sequentially assigned to the potential ranks from the low potential side and the potential ranks are set to correspond to user data items to be recorded as shown in FIG. 12. They are arranged in an array that is well known as a Gray code (U.S. Pat. No. 2,632,058). The corresponding data is a 2-bit value stored in work01. As is explained in steps S804 and S1003, the lower 1-bit of the corresponding data is arranged to be set to "1" on the lower potential rank side and to "0" on the higher potential rank side. The relation between the potential rank and the corresponding data is not limited to that shown in FIG. 12 and can be set as desired.

The program U is executed not to set the fixed potential to the potential rank rx but to set the lowest potential that is not lower than the potential indicated by the lower limit to the corresponding cell, measure the lower limit and upper limit of the thus set potential again and respectively set the values to the EffectL[wx][rx] and EffectU[wx][rx].

First, the program processing unit 14B sets a program start potential Vps to a program potential Vprog (step S1101). Then, it selects a cell whose potential must be raised to each potential rank. At the present time, upper-bit data is stored in work0 and lower-bit data is stored in work1. The relation between rx and the potential rank is shown in FIG. 12. In order to derive the relation, values are calculated for the respective bit lines BL as follows and the results are set in positions corresponding to the respective bit lines BL of work3.

At the time of rx=1, work0 ∨ ¬work1 (step S1102)

At the time of rx=2, work0 ∨ work1 (step S1103)

At the time of rx=3, ¬work0 ∨ work1 (step S1104)

In this case, "∨" indicates the operation of calculating the logical sum and "¬" indicates the logical inversion operation. Thus, work3 corresponding to the cell whose potential is raised is set to "0".

As a modification of this embodiment, a method for performing a calculation as follows is provided.

At the time of rx=1, work0 ∧ work1 (step S1102)

At the time of rx=2, work1 (step S1103)

At the time of rx=3, ¬work0 ∨ work1 (step S1104)

In this case, "∧" indicates the operation of calculating the logical product. The modification of the operation indicates that cells whose potentials are set to the potential ranks "2", "3" as targets are also charged to the potential rank "1" at the same time the cell is charged to the potential rank "1", for example. With this method, when the program U is executed by next setting rx to "2", "3", the processing time can be reduced since the potential corresponding to the potential rank "1" is already charged to the corresponding cells. Further, an influence of the final capacitive coupling effect by the adjacent cells whose potentials are set to the potential ranks "2", "3" as targets on the cell whose potential is set to the potential rank "1" as a target can be slightly reduced.

Next, the program processing unit 14B checks whether or not all of the bits of work3 are already set to "1" at this time (step S1105). If all of the bits are set to "1", the process proceeds to step S1114. This means that a cell that is desired to be set to the potential rank is not present. As no problem occurs if step S1105 is omitted, the time required for execution of the next step S1106 can be reduced when all of the bits of work3 are determined to be set to "1" in step S1105.

If at least one of the bits of work3 is "0", the program processing unit 14B sets the read potential Vr to 0.15 (V)*LowerLimit, reads potentials of the cells on the word line corresponding to the variable wx and stores the result to work2 (step S1106). Then, the program processing unit 14B replaces the respective bits of work3 by values obtained by calculating "work3 ∨ ¬work2" (step S1107). Steps S1106 and S1107 are operations for checking whether or not potentials of the cells that are desired to be set to the potential rank rx already exceed the variable LowerLimit and leaving only the bit of work3 corresponding to a cell whose potential does not exceed the variable LowerLimit as "0". As a result, the recording pulse application process for the cell whose potential exceeds the lower limit of the potential rank can be omitted since corresponding work3 is set to "1".

Subsequently, the program processing unit 14B checks whether or not all of the bits of work3 are set to "1" (step S1108). If all of the bits are set to "1", the process proceeds to step S1114. If at least one of the bits is "0", the program processing unit 14B performs the following program process.

The program processing unit 14B checks whether or not the program potential Vprog exceeds the upper limit Vpe (step S1109). If the upper limit is exceeded, it informs the calling source of the program U that an abnormality has occurred and terminates the program process. If Vprog is not higher than Vpe, the program potential of 0.15 (V)*Vprog is applied to cells of each BL in which work3[rx]=0 (step S1110).

Subsequently, the program processing unit 14B sets read potential Vr to 0.15 (V)*LowerLimit, reads potentials of the cells on a word line corresponding to wx and stores the result to work2 (step S1111).

Then, the program processing unit 14B replaces the respective bits of work3 by values obtained by calculating "work3 ∨ ¬work2" (step S1112). By the above process, work3 corresponding to a cell whose potential exceeds the lower limit of the potential rank is set to "1". Then, difference potential Vpd is added to the program potential Vprog (step S1113). After this, the process returns to step S1108.

By performing a loop of steps S1108 to S1113, the program potential is applied to the cell whose potential does not reach the LowerLimit, and then whether or not the potential thereof has reached the LowerLimit is checked. The process is terminated when the program execution ends in failure or when the potentials of all of the cells that are desired to be set to the potential rank rx have reached the LowerLimit.

Subsequently, in the process after step S1114, the actual lower limit and upper limit of the potentials of the cells contained in the potential rank rx are measured. First, the program processing unit 14B sets the variable Vx to the present LowerLimit (step S1114). Further, the program processing unit 14B sets the EffectL[wx][rx] and EffectU[wx][rx] to Vx (step S1115). The values are initial setting values of the potential rank and vary as the process of steps described later proceeds. Vx is a counter for sequentially counting up the levels of the EffectL[wx][rx] and EffectU[wx][rx] for each set value "1" (in this embodiment, for every 0.15V).

The following calculations are made for the respective bit lines BL based on the present potential rank rx and the results are set in positions corresponding to the bit lines BL of work3.

At the time of rx=1, work0 V ¬work1 (step S1116)
At the time of rx=2, work0 V work1 (step S1117)
At the time of rx=3, ¬work0 V work1 (step S1118)

The above calculations are the same as steps S1102 to S1104.

Then, the program processing unit 14B sets read potential Vr to 0.15(V)*Vx, reads potentials of the cells on the word line corresponding to wx and stores the result to work2 (step S1119).

Next, the program processing unit 14B checks whether BL in which work3 V ¬work2=0 is present or not (step S1120). If no such BL is present, it sets the EffectL[wx][rx] to the present Vx (step S1121). "work3 V ¬work2=0" indicates that the cell potential is not lower than the LowerLimit and is lower than Vx. If no such cell is present, it indicates that the potentials of all of the cells that are to be set to the potential rank rx exceed Vx.

Subsequently, the program processing unit 14B checks whether or not the calculation result of work3 V work2 is "1" for all of the bit lines BL (step S1122). If the calculation result for at least one bit line BL is "0", the program processing unit 14B increases the variable Vx by one (step S1123). Then, if the variable Vx is less than the cell potential upper limit Vmax (step S1124), the process returns to step S1119, and if the variable Vx exceeds the cell potential upper limit Vmax, the program processing unit 14B informs of occurrence of abnormality to the calling source of the program U and terminates the program process. The calculation result "0" of work3 V work2 indicates that the potential of the cell belongs to the potential rank rx and the cell potential exceeds Vx. In this case, since it is understood that the EffectU[wx][rx] that is an upper limit of the potential rank is higher than Vx, it is necessary to repeatedly perform the above process. Vmax is an upper limit of the potential of the cell that can be adequately handled and is set to "33" in this embodiment (approximately 5V in terms of voltage).

Next, the program processing unit 14B sets the EffectU[wx][rx] to the present Vx (step S1125) if the calculation result of work3 V work2 is "1" for all of the bit lines BL and terminates the program U. The operation result "1" of work3 V work2 means that the potential of the cell is not set to rx as a target (work3=1) or the cell potential is not lower than the LowerLimit and is lower than Vx. When all of the cells satisfy the above condition, Vx may be regarded as being the upper limit of the potential rank. Therefore, this is set to the EffectU[wx][rx].

[5. Read Process]

Next, the read process performed by the controller 14 of the NAND flash ROM is explained. FIG. 13 is a flowchart for illustrating the read process of the NAND flash ROM (read processing unit 14C).

The read process is divided according to whether only the lower bit (L bit) of a to-be-read cell is programmed or the upper bit (U bit) of the to-be-read cell are programmed or whether an L-bit read process or U-bit read process is performed.

First, the read processing unit 14C receives an address of a page to be read from the host and stores the address as a variable PageAddress (step S1301). Then, the read processing unit 14C extracts a WL number from the PageAddress, and sets a variable wx to the WL number (step S1302). Next, the read processing unit 14C sets all of variables HitNumber set by a potential determination that will be described later to "0" (step S1303). The variable HitNumber is set in a linear array and has elements of 0 to (Vmax−1).

Subsequently, the read processing unit 14C checks whether the U bit is programmed in the cell or not. A program L in this embodiment does not change the variable EffectU, and a potential of the EffectU[wx][rx] is first set at a program U. By utilizing this fact, it is determined that the U bit is non-recorded when the EffectU[wx][3] of the potential rank "3" is "0", that is, when the potential is not set to the EffectU[wx][3] and that the U bit is already recorded when it is set to a value other than "0" (step S1304).

In the U-bit non-recording process, first, the read processing unit 14C checks whether the operation is an L-bit read operation or not (step S1305), based on a value of the L/U selector of FIG. 9. If the operation is the L-bit read operation, a read potential Vr is set to a threshold value between data "1" (erase level) and data "0" recorded in the cell by use of the program L as described before and recording data of the cell is determined by use of the read potential Vr. That is, the read processing unit 14C sets read potential Vr to 0.15(V)*MarginL/2, reads potentials of the cells on the word line corresponding to wx and stores the result to the work register work0 (step S1306). After this, the process proceeds to step S1317.

In the case of the U-bit read operation, an expected value is not defined since a U bit is non-recorded, but all of the bits of work0 are set to "1" in this embodiment (step S1307). After this, the process proceeds to step S1317.

If it is determined in step S1304 that the U bit is programmed, the read processing unit 14C refers to the value of the L/U selector of FIG. 9 to check whether the operation is an L-bit read operation or not (step S1308). If it is the L-bit read operation, it sets the variable rx indicting the potential rank to "1" (step S1309). Then, the potential determination unit 14D performs potential determination (step S1310). After this, the process proceeds to step S1317.

When both of the L bit and U bit are programmed, the L bit can be regarded as "1" in the potential rank "0" or "1" and as "0" in the potential rank "2" or "3" since the relation shown in FIG. 12 is set between the potential rank and data. In order to make the above determination, the potential determination process is performed in one position of rx=1. The potential determination method is described later.

Next, the read processing unit 14C sets the variable rx to "0" (step S1311) when the U-bit read operation is determined in step S1308. Then, the potential determination unit 14D performs the potential determination process (step S1312). Subsequently, the read processing unit 14C copies all of bit data items of work0 obtained as the result to work3 (step S1313). Next, the read processing unit 14C sets the variable rx to "2" (step S1314). Then, the potential determination unit 14D performs the potential determination process (step S1315). Subsequently, the read processing unit 14C calculates the operation of ¬work0 V work3 for bits corresponding to all of the bit lines BL and sets the results to corresponding positions of work0 (step S1316).

According to FIG. 12, the U bit is set to "1" at the time of potential rank "0" or potential rank "3" and "0" at the time of potential rank "1" or potential rank "2". Therefore, in steps S1311 to S1316, the potential determination process is performed in two positions of rx=0 and rx=2 and the results are combined, that is, the operation of ¬mark0 V work3 is performed to derive the value of the U bit. Then, data of work0 is transmitted to the host (step S1317) and the read process is terminated.

[5-1. Potential Determination Process]

Figure 14:
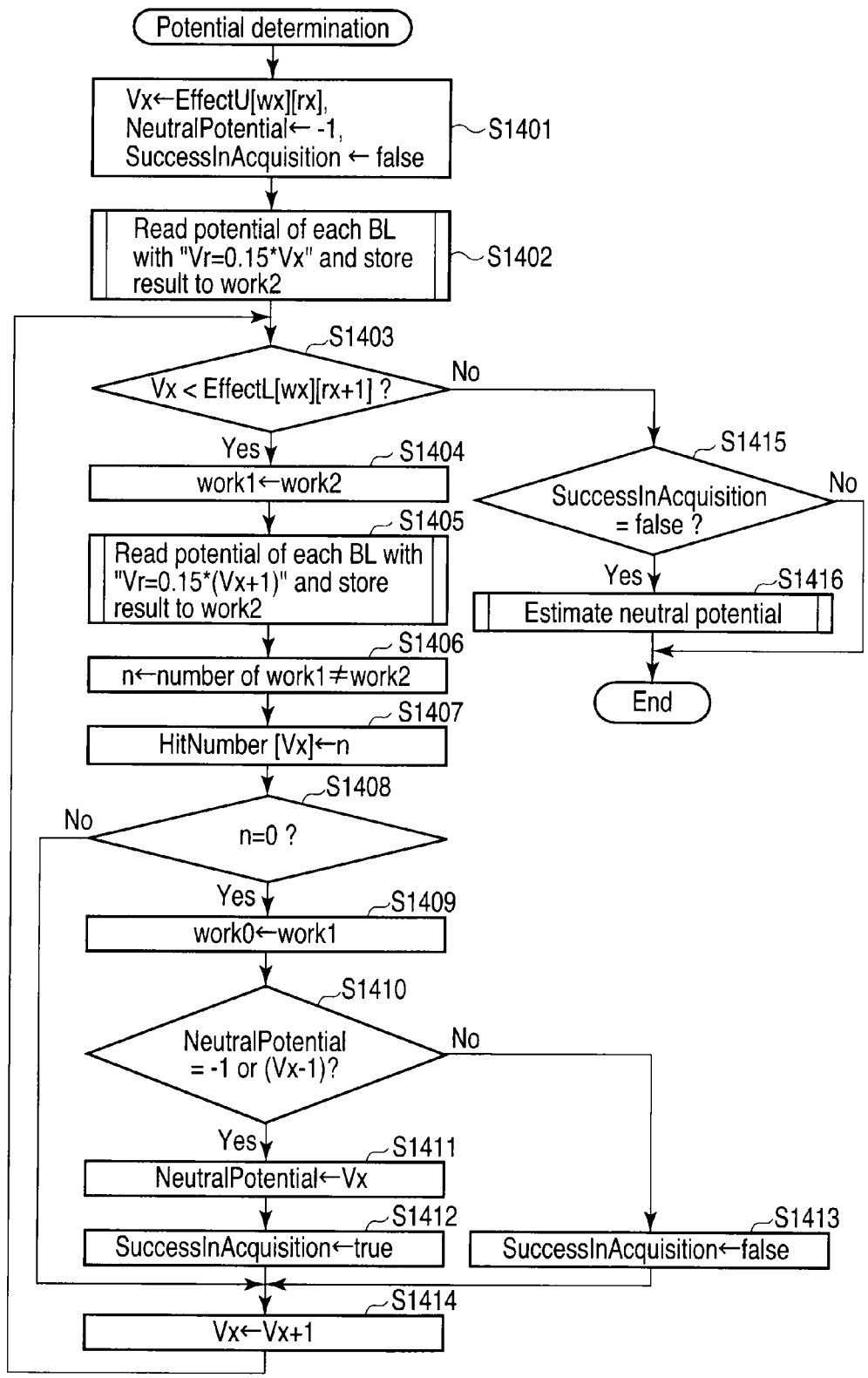
FIG. 14 is a flowchart for illustrating a potential determination process of the NAND flash ROM.

Next, the potential determination process performed by the controller 14 of the NAND flash ROM is explained. FIG. 14 is a flowchart for illustrating the potential determination process of the NAND flash ROM (potential determination unit 14D).

When the potential determination process is performed, a potential rank rx is already given. The potential determination process differentiates between the state in which the potentials of the individual cells are set not higher than the potential rank rx and the state in which the potentials are set not lower than the potential rank (rx+1) particularly while the boundary therebetween is being determined. Then, after the result of the potential determination process, the following process is performed.

Information indicating whether the determination process is successfully performed or not is expressed as a variable SuccessInAcquisition.

Potential set as the boundary when the determination process is successfully performed or separation potential based on estimation when the determination process is not successfully performed is expressed as a variable NeutralPotential.

The result of determination of cell potential with the variable NeutralPotential set as a threshold value is stored in work0 with the lower side of the cell potential set as "1".

The number of cells whose potentials exceed Vx and are lower than (Vx+1) is set as a variable "HitNumber [Vx]". In this case, Vx is not lower than the EffectU[wx][rx] and is lower than L[wx][rx+1].

First, the potential determination unit 14D initializes various variables. The variable Vx is set to the EffectU[wx][rx], the variable NeutralPotential is set to "−1" and the variable SuccessInAcquisition is set to a logical value "false" (step S1401). Then, the potential determination unit 14D sets the read potential Vr to 0.15(V)*Vx, reads potentials of cells on a word line corresponding to wx and stores the result in work2 (step S1402).

Subsequently, the potential determination unit 14D sequentially performs the process of steps S1403 to S1414 (step 1403) while the relation of Vx<EffectL[wx][rx+1] is satisfied.

First, the potential determination unit 14D copies all of the data items of work2 to work1 (step S1404). Then, the potential determination unit 14D sets the read potential Vr to 0.15 (V)*(Vx+1), reads potentials of cells on a word line corresponding to wx and stores the result in work2 (step S1405). Subsequently, the potential determination unit 14D checks work1 and work2 corresponding to all of the bit lines BL and counts the number of values different from one another and expresses this number as a variable n (step S1406). After this, the variable HitNumber [Vx] is set to n (step S1407).

Next, if n is not "0", the process proceeds to step S1414 (step S1408). The fact that n is not "0" indicates that a cell whose potential is set between Vx and (Vx+1) is present, by checking, at this time point, the cell potential by use of two read potentials Vr; Vx and (Vx+1).

If it is determined in step S1408 that n is not "0", all of the data items in work1 are copied to work0 (step S1409). The potential at which the variable HitNumber is "0" is a possible candidate potential that can be used to separate adjacent potential ranks rx and (rx+1). If the two potential ranks are actually separated, the potential in work0 now copied is used as the cell potential determined by use of the variable NeutralPotential.

If the variable NeutralPotential is kept at the initial value "−1" or a value (=Vx−1) of Vx checked immediately before (step S1410), Vx is set to the variable NeutralPotential (S1411) and the variable SuccessInAcquisition is set to "true" (step S1412). On the other hand, if the variable NeutralPotential is set to a value different from the above values, the variable SuccessInAcquisition is set to "false" without changing the value of the variable NeutralPotential (step S1413). Potentials Vx that do not contain potentials of cells are permitted to be successively provided, but if the potentials Vx are intermittently provided, whether cells of potentials remaining therebetween may be incorporated on the upper side or lower side of the potential rank cannot be determined. In such a case, acquisition of the variable NeutralPotential results in failure and the variable SuccessInAcquisition is set back to "false".

Finally, Vx is increased by one (step S1414) and the process returns to step S1403.

If the process of checking cells of potentials ranging from the EffectU[wx][rx] to the EffectL[wx][rx+1]−1 is terminated, whether the variable SuccessInAcquisition is set to "false" or not is next checked (step S1415). If it is "true", the potential determination process is terminated as it is. If it is "false", the variable NeutralPotential estimation process is performed (step S1416) and the potential determination process is terminated.

[5-2. Neutral Potential Estimation Process]

Next, the neutral potential estimation process performed by the controller 14 of the NAND flash ROM is explained. FIG. 15 is a flowchart for illustrating the neutral potential estimation process of the NAND flash ROM (potential determination unit 14D).

When the neutral potential estimation process is performed, that is, when the variable SuccessInAcquisition is set to "false", potentials whose cells are not present are not provided between the EffectU[wx][rx] and the EffectL[wx][rx+1] or a plurality of cells are intermittently present between the EffectU[wx][rx] and the EffectL[wx][rx+1]. In such a case, it is generally impossible to correctly draw a boundary line, but in this embodiment, a boundary that can be easily calculated is set.

The potential determination unit 14D calculates a neutral point between the EffectU[wx][rx] and the EffectL[wx][rx+1], that is, (EffectU[wx][rx]+EffectL[wx][rx+1])/2 and sets the neutral potential according to the calculation result (step S1501). Since the EffectU[ ][ ] and EffectL[ ][ ] are integral numbers, a fraction may occur when the average thereof is taken, but the fraction is discarded.

Next, the potential determination unit 14D sets read potential Vr to 0.15(V)*neutral potential, reads potentials of cells on a word line corresponding to wx, stores the result to the work register work0 (step S1502) and terminates the neutral potential estimation process. Thus, even when the potential ranks cannot be separated by use of the potential determination process of FIG. 14, a neutral potential can be newly set by use of the neutral potential estimation process.

[6. Patrol Process]

Figure 16:
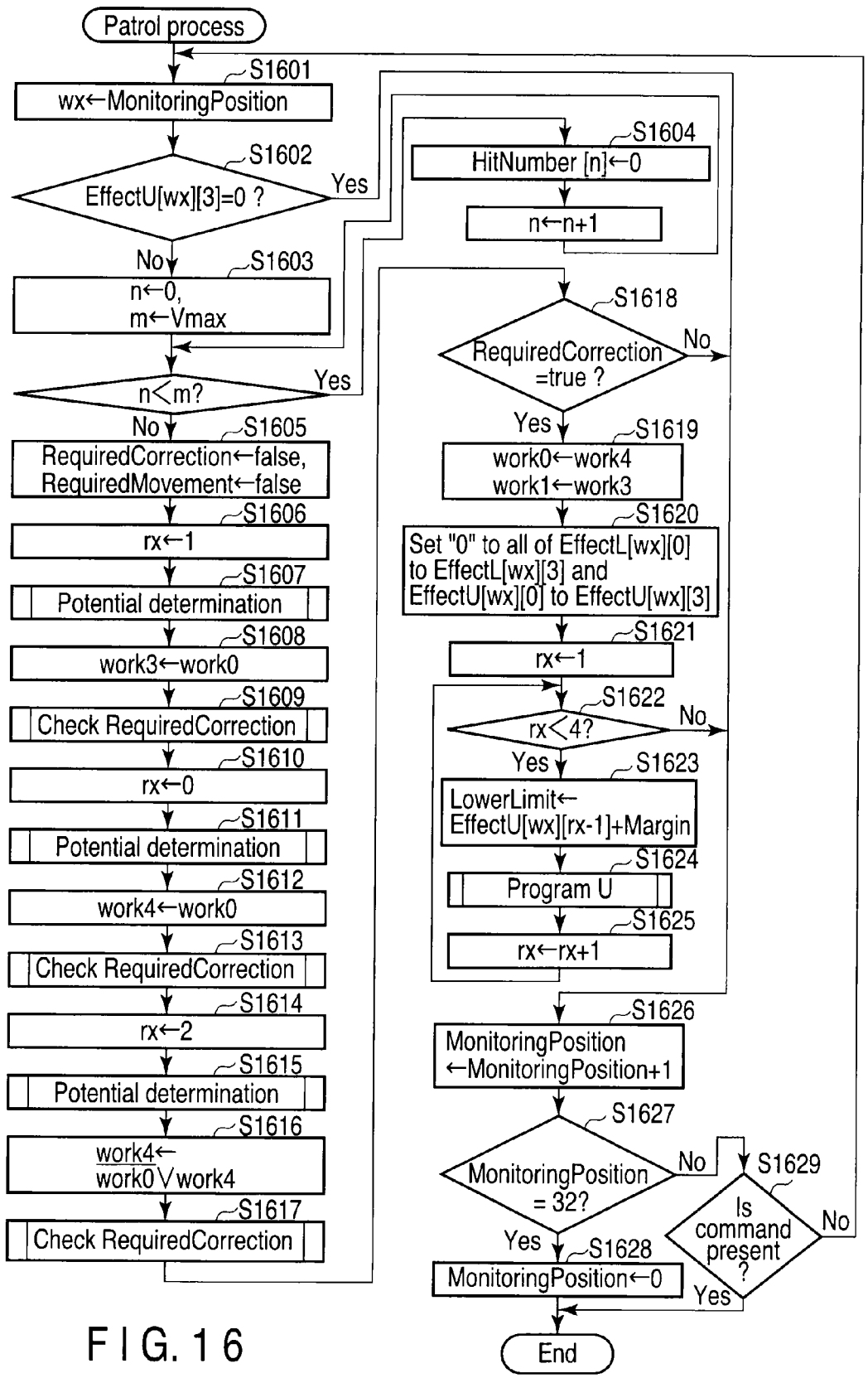
FIG. 16 is a flowchart for illustrating a patrol process of the NAND flash ROM.

Next, the patrol process performed by the controller 14 of the NAND flash ROM is explained. FIG. 16 is a flowchart for illustrating the patrol process of the NAND flash ROM (patrol processing unit 14E).

The patrol process has a loop process controlled by a variable MonitoringPosition as a whole. The variable MonitoringPosition indicates a word line to be monitored and is stored in the nonvolatile storage circuit 15. By using the variable MonitoringPosition, the patrol process can be performed while a word line is sequentially changed for each loop.

First, the patrol processing unit 14E copies the content of the MonitoringPosition to a variable wx (step S1601). Then, the patrol processing unit 14E checks whether the word line requires a patrol process or not (step S1602). That is, whether the EffectU[wx][3] is "0" or not is checked, and if it is "0", the process proceeds to step S1626. The EffectU[wx][3] that is "0" means that the program U is not yet executed for the corresponding word line, that is, data is not recorded in cells or only the lower bit is recorded. In this case, the patrol process is not performed.

Next, the patrol processing unit 14E fills a range from the variable HitNumber[0] to the HitNumber[Vmax−1] with "0" (steps S1603, S1604). Then, variables RequiredCorrection and RequiredMovement are both initialized to "false" (step S1605).

Subsequently, the read process for the lower bit (L bit) is performed by use of the potential rank "1". That is, the patrol processing unit 14E sets the variable rx indicating the potential rank to "1" (step S1606). Then, the potential determination unit 14D performs the potential determination process shown in FIG. 14 (step S1607). Further, the patrol processing unit 14E copies work0 showing the potential determination result to work3 (step S1608). At this time, the L bit of each cell on the word line (wx) is stored in work3. After this, the patrol processing unit 14E performs a required-correction check process (step S1609). The required-correction check process will be described later.

Next, the read process for the upper bit (U bit) is performed by use of the potential rank "0" and potential rank "2". That is, the patrol processing unit 14E sets the variable rx to "0" (step S1610). Then, the potential determination unit 14D performs the potential determination process shown in FIG. 14 (step S1611). Further, the patrol processing unit 14E sets the respective bits of work0 to corresponding bits of work4 (step S1612). After this, the patrol processing unit 14E performs a required-correction check process (step S1613).

Next, the patrol processing unit 14E sets the variable rx to "2" (step S1614). Then, the potential determination unit 14D performs the potential determination process shown in FIG. 14 (step S1615). Further, the patrol processing unit 14E calculates "¬work0 V work4" for each bit by use of the potential determination result and sets the calculation result to corresponding bits of work4 (step S1616). After this, the patrol processing unit 14E performs a required-correction check process (step S1617).

When the above process is terminated, the set value of each cell is set in work43. Further, "true" or "false" is set in the variable RequiredCorrection.

Then, the patrol processing unit 14E advances the process to step S1626 when the variable RequiredCorrection is "false" (step S1618). This is performed when it is understood that no correction is required for the word line as the checking result. When it is determined in step S1618 that the variable RequiredCorrection is "true", data of work43 is copied to work01 (step S1619). In step S1619, a 2-bit copy process is performed for each bit line.

Subsequently, the patrol processing unit 14E sets all of the EffectL[wx][0] to the EffectL[wx][3] and the EffectU[wx][0] to the EffectU[wx][3] to "0" (step S1620). After this, the patrol processing unit 14E repeatedly performs a process of calculating (EffectU[wx][rx−1]+Margin), setting the result to the variable LowerLimit (step S1623) while the variable rx is increased one by one until it reaches "4" from "1" (steps S1621, S1622, S1625) and executing the program U (step S1624). The process in this part is the same as the process of steps S807 to S811 of the program process explained with reference to FIG. 8.

The process of steps S807 to S811 is performed to calculate the LowerLimit based on the EffectL[wx][ ] that has already been set, execute the least program that exceeds the above potential for a required cell and calculate the EffectL[wx][ ] and EffectU[wx][ ] based on potentials of the cells that are actually set. Therefore, the potential can be set to each cell only if corresponding data of each cell is provided, and the EffectL[wx][ ] and EffectU[wx][ ] can be set again according to the cell potential irrespective of the level of the cell potential set at the present time.

Next, the patrol processing unit 14E adds "1" to MonitoringPosition (step S1626) if rx=4 is determined in step S1622. Then, the patrol processing unit 14E checks whether or not all of the word lines in the block are processed, that is, whether or not the MonitoringPosition is set to "32" (step S1627). If the MonitoringPosition is set to "32", the MonitoringPosition is set to "0" (step S1628) and the patrol process is terminated. If the MonitoringPosition is not set to "32", the patrol processing unit 14E checks whether or not a new command is received from the host (step S1629). If a new command is received, the patrol process is terminated. If a new command is not received, the process returns to step S1601 and is continuously performed.

In the NAND flash ROM comprising a plurality of blocks, the range from "0" to "block number*number of word lines−1" is regarded as an effective MonitoringPosition. Then, if it is determined in step S1627 that the MonitoringPosition is set to "block number*number of word lines", the process proceeds to step S1628 and if not, the process proceeds to step S1629. Further, the correction process can be performed to set the remainder obtained when the MonitoringPosition is divided by the number of word lines for each block to wx in step S1601 and set the quotient obtained when the MonitoringPosition is divided by the number of word lines for each block to a BlockNumber.

Although not shown in FIG. 16, the program U may be erroneously terminated in some cases. In such a case, information to this effect is transmitted to the host and the patrol process is terminated. At this time, data items of the corresponding word line WL remain in work01. The host issues a different command that is not described here to acquire data items and writes the data items to adequate positions of the NAND flash ROM after correcting the data items as required.

[6-1. Required-Correction Check Process]

Next, the required-correction check process performed by the controller 14 of the NAND flash ROM is explained. FIG. 17 is a flowchart for illustrating the required-correction check process of the NAND flash ROM (patrol processing unit 14E).

In the required-correction check process, whether or not a further correction is required is determined by use of the result of the potential determination process in step S1607, for example. Whether correction is required or not is determined only when the variable SuccessInAcquisition is "true", that is, only when two potential ranks are separated by use of a correct method.

First, the patrol processing unit 14E checks whether the variable RequiredMovement is "true" or not (step S1701). If the variable RequiredMovement is "true", the required-correction check process is terminated. The variable RequiredMovement is "true" indicates that acquisition of the variable NeutralPotential results in failure by the previous potential determination process for the potential ranks, that is, that the two potential ranks cannot be separated. In this case, the relief operation cannot be performed by use of the patrol process and it is unnecessary to perform the determination process for the potential rank of this cycle.

Next, the patrol processing unit 14E checks whether the variable SuccessInAcquisition is "true" or not (step S1702). If the variable SuccessInAcquisition is "false", the variable RequiredMovement is set to "true" and the variable RequiredCorrection is set to "false" (step S1703). Then, the required-correction check process is terminated. When the variable RequiredMovement is set to "true", the variable RequiredCorrection is set to "false" irrespective of whether the variable RequiredCorrection is previously performed or not.

If the variable SuccessInAcquisition is "true" in step S1702, the patrol processing unit 14E checks whether the variable RequiredCorrection is "true" or not (step S1704). If the variable RequiredCorrection is "true", the required-correction check process is terminated. This is because the succeeding process becomes useless since the required-correction check process at this time will not return the variable RequiredCorrection to "false" if the process has come to this stage. The "required correction is true" indicates that the potential rank having a sufficiently large margin can be set again if the threshold value is corrected.

If it is determined in step S1704 that the variable RequiredCorrection is "false", a variable used for checking is initialized. First, the patrol processing unit 14E sets the EffectU[wx][rx] to Vx and sets the EffectL[wx][rx+1] to m (step S1705). Then, a variable Nzero is set to an initial value "0". The variable Nzero indicates the number of potentials in which cells of the potentials are not present in gaps between the potential ranks at this time.

Subsequently, the patrol processing unit 14E repeatedly performs the following process of steps S1708 to S1710 in a period of Vx<m ((step S1707). The patrol processing unit 14E checks whether the variable HitNumber [Vx] is "0" or not (step S1708). If the variable HitNumber [Vx] is "0", Nzero is increased by one (step S1709) and if not, the process proceeds to step S1710 without performing step S1709. Then, the patrol processing unit 14E increases Vx by one (step S1710).

If Vx≧m is satisfied in step S1707, the patrol processing unit 14E checks whether or not Nzero≧MarginA (step S1711). In the case of Nzero<MarginA, the variable RequiredCorrection is set to "true" (step S1712) and if not, the variable RequiredCorrection is kept set at "false" and the required-correction check process is terminated. As is explained before, Nzero indicates the number of potentials in which cells of the potentials are not present, as is already explained before, and the variable MarginA is a certain constant smaller than or equal to the variable Margin ("3" in this embodiment) and is set to 2 in this embodiment. When the value of Nzero is smaller than the variable Margin and is larger than or equal to the variable MarginA, a potential rise or potential drop occurs in some of the cells whose potentials belong to the two adjacent potential ranks, but a gap that can be sufficiently determined is present between the two potential ranks, thus it is not necessary to perform a correction process. Therefore, it is determined in step S1626 of FIG. 16 that the variable RequiredCorrection is "false" and the process proceeds to step S1626 without performing the correction process for the corresponding WL.

The patrol process shown in FIG. 16 is performed by use of the variables RequiredMovement and RequiredCorrection set in the above required-correction check process.

[7. Effect of First Embodiment]

The effect obtained by this embodiment is explained with reference to concrete examples of FIG. 18 to FIG. 21 showing cell potential states.

Concrete Example 1

FIG. 18 is a diagram for illustrating a concrete example of correction non-requirement. FIG. 18-0 is a diagram showing the initial state set immediately after information is recorded in a cell. Seven cells, "a" to "g", are provided, the cells "a", "b", "c" are set in the potential rank rx and the cells "d", "e", "f", "g" are set in the potential rank (rx+1). The potentials of the cells "a", "b", "c" are set at the potential of the "EffectU[wx][rx]−1" and are set to the highest potential in the potential rank. Likewise, the potentials of the cells "d", "e", "f", "g" are set at the potential of the EffectL[wx][rx+1] and are set to the lowest potential in the potential rank.

FIG. 18-1 is a diagram showing the state in which the potentials of the cells "d", "e" are lowered to the potential "EffectL[wx][rx]−1". In the conventional technique, a program is immediately executed for the cell whose potential is lowered to return the potential thereof to the potential "EffectL[wx][rx+1]" or higher. However, in the patrol process of this embodiment, it is determined that a sufficiently large gap (MarginA=2) is provided between the potential ranks and the state is left as it is. This is determined by step S1711 of FIG. 17. By performing the determination process, the number of program operations can be reduced.

Concrete Example 2

FIG. 19 is a diagram for illustrating a concrete example of a re-programming operation. FIG. 19-0 is a diagram showing the initial state that is the same as that of FIG. 18-0.

FIG. 19-1 is a diagram showing the state in which the potentials of the cells "d", "e", "f" are lowered, the potentials of the cells "d", "e" are lowered to the potential "EffectL[wx][rx+1]−1" and the potential of the cell "f" is lowered to the potential "EffectL[wx][rx+1]−2". In the conventional technique, since the threshold value used to determine the potential rank is fixed in this state, there is a possibility that the cell potential of the potential rank rx will be erroneously determined to be raised to the potential "EffectL[wx][rx+1]−2", depending on the threshold value.

On the other hand, in the patrol process of this embodiment, since potentials of cells are present in the potential "EffectL[wx][rx+1]−1" and no cell potential is present in the potential "EffectL[wx][rx+1]−3", it is determined that the potential of the cell "f" has reached the potential "EffectL[wx][rx+1]−2" as the result of the potential drop and the cell is set as a to-be-reprogrammed object. Then, as shown in FIG. 19-2, the cells "d", "e", "f" are reprogrammed and the potentials thereof are set to be higher than or equal to the potential "EffectL[wx][rx+1]". As a result, a variable Margin="3" is attained between the potential rank rx and the potential rank (rx+1).

Concrete Example 3

FIG. 20 is a diagram for illustrating a concrete example of a potential rank correction operation. FIG. 20-0 is a diagram showing the initial state, which is the same as that of FIG. 18-0.

FIG. 20-1 shows a case wherein the potential of a cell "b" is present in the potential "EffectU[wx][rx]+2" and the potential of a cell "c" is present in the potential "EffectU[wx][rx]+1" due to a potential rise. In the conventional technique, there occurs a possibility that the original potential rank of the cell "b" is erroneously determined, thus it becomes necessary to take protection means such as a data rearrangement operation by the host or refresh operation for the cell, and a block erase process will occur accordingly.

On the other hand, in the patrol process of this embodiment, as shown in FIG. 20-2, the upper limit of the potential rank rx is re-set to a value corresponding to the original potential "EffectU[wx][rx]+2" in the program U (step S1624) for the potential rank rx so as to incorporate the potentials of the cells "b", "c" in the potential rank rx. As a result, a sufficiently large margin can be attained again between the potential rank rx and the potential rank (rx+1) without performing the erase operation, although it becomes necessary to perform the reprogram operation for the cells "d", "e", "f". Therefore, the number of erase operations can be reduced and the life of the NAND flash ROM can be lengthened.

Concrete Example 4

FIG. 21 is a diagram for illustrating concrete examples of reprogram and potential rank correction operations. FIG. 21-0 is a diagram showing the initial state that is the same as that of FIG. 18-0.

FIG. 21-1 shows the state in which a cell whose potential is raised and a cell whose potential is dropped are provided. In the conventional technique, it becomes necessary to perform a block erase process, like the case of concrete example 3.

On the other hand, in the patrol process of this embodiment, as shown in FIG. 21-2, the EffectU[wx][rx] is increased by one by use of the program U (step S1624) and the potential of the cell "c" is incorporated into the potential rank rx. Further, the cells "d", "e", "f", "g" are programmed to the potential "EffectU[wx][rx]+Margin". As a result, a sufficiently large margin can be attained again between the potential rank rx and the potential rank (rx+1) without performing the block erase operation.

The patrol process in this embodiment is performed in a so-called idle state in which no command is given to the NAND flash ROM. Therefore, there is provided a route (step S1629) in the loop of the patrol process in which whether a command is received or not is checked at an adequate timing and to which the patrol process returns after it is interrupted if a command is received. In this case, the variable MonitoringPosition holds a value that is previously obtained. Therefore, when the next patrol process is performed, the process is restarted from a word line indicated by the MonitoringPosition. As a result, the patrol process can be prevented from being repeatedly performed for part of the word lines.

Further, according to this embodiment, the patrol process is performed while no command is issued from the host. The time for which the service for the host is delayed is equal to the time required for the patrol process already performed to reach step S1629. Therefore, if this embodiment is realized, the command issued from the host is subjected to substantially no delay.

Second Embodiment

In the second embodiment, the process of determining whether the patrol process is started or not is performed in response to a command from the host. The configuration of a NAND flash ROM according to this embodiment is the same as that of FIG. 1 except that the timer T1 of FIG. 1 is omitted.

FIG. 22 is a flowchart for illustrating the whole operation of the NAND flash ROM (controller 14) according to the second embodiment. FIG. 22 is different from FIG. 6 in that the timer T1 is omitted and a "patrol command" must be received from the host as a condition of starting the patrol process. In FIG. 22, the point that corresponding processes are performed in response to a read command, program command and erase command after the power source is turned on is the same as that of the first embodiment except the operation of the timer T1.

The NAND flash ROM receives a patrol command from the host. The patrol command is a command issued to the NAND flash ROM when the host is set into an idle state (the user operation is interrupted and a system is set into a standby state) or when it is desired for the host to improve the recording state of the NAND flash ROM on the assumption that it will take a long time. At this time, there is a slight chance that the flash ROM will immediately receive a command such as a read command, program command or the like for operating the cell array.

When receiving a patrol command from the host, the controller 14 checks whether the timer T0 indicates "0" hours (step S2207) and performs the patrol process if it is "0" hours. At this time, determination of the timer T1 is not incorporated in the condition of performing the patrol process. The process performed after the patrol process is the same as that of the first embodiment.

As described above, according to the second embodiment, it is possible to more positively cause the host to perform the patrol process with respect to the NAND flash ROM.

Further, when a read command, program command or the like is to be issued to the NAND flash ROM in the near future while the host is performing an internal process or the like, the frequency at which the patrol process is interrupted can be suppressed by issuing no patrol command. As a result, occurrence of a response delay caused by a wait time due to interruption of the patrol process can be prevented.

Third Embodiment

In the third embodiment, a process different from the neutral potential estimation process of FIG. 15 in the first embodiment is used. The neutral potential estimation process of FIG. 15 explained in the first embodiment is simple and is suitably used for a high-speed process. However, when the cell potential variation becomes uneven, two adjacent potential ranks cannot be adequately separated. Therefore, in the third embodiment, a neutral potential is estimated based on the number of cells whose potentials are set in a margin between the two adjacent potential ranks.

Figure 23:
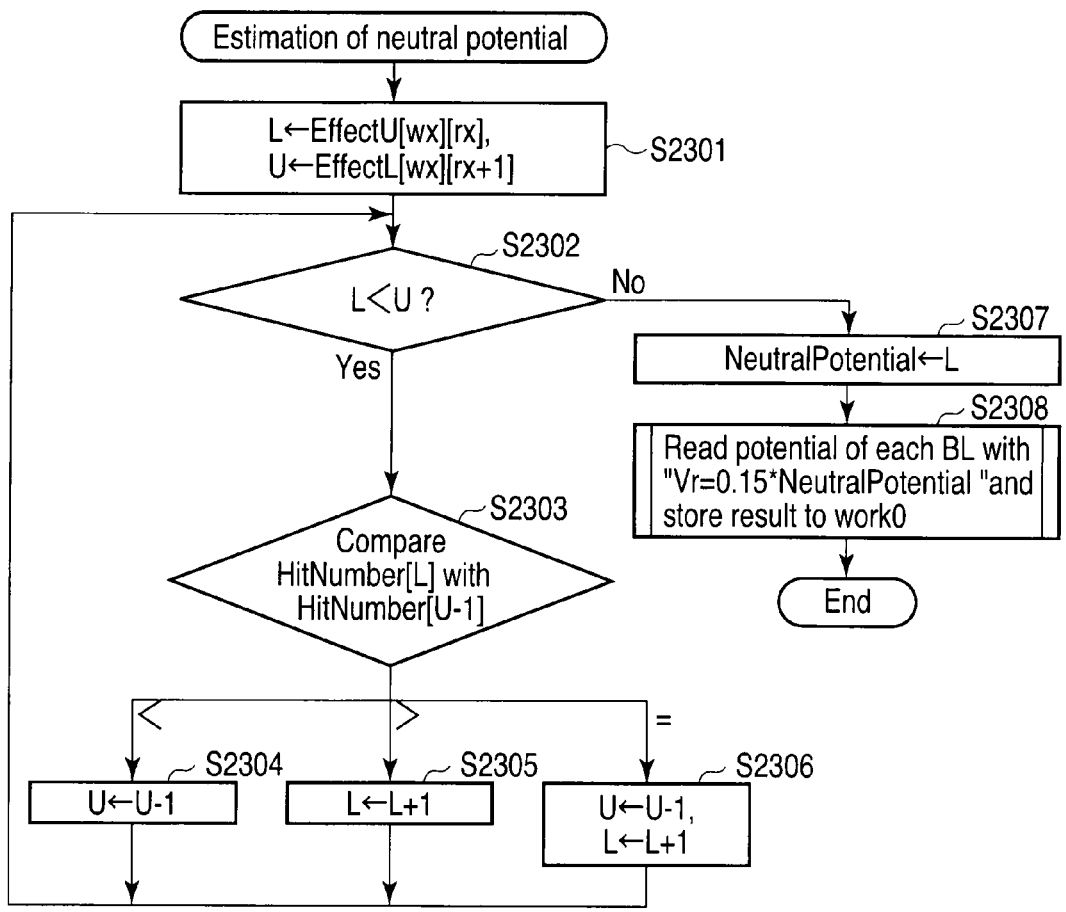
FIG. 23 is a flowchart for illustrating a neutral potential estimation process of a NAND flash ROM according to a third embodiment.

FIG. 23 is a flowchart for illustrating the neutral potential estimation process of a NAND flash ROM (potential determination unit 14D) according to the third embodiment. The configuration of the NAND flash ROM is the same as that of FIG. 1 and the processing method other than the neutral potential estimation process is the same as that of the first embodiment.

In the third embodiment, a neutral potential is estimated by referring to a variable "HitNumber [ ]" acquired in FIG. 14. The variable "HitNumber [ ]" is a record of the number of cells that are turned off at a certain potential and turned on at a potential higher than the such potential by one level of potentials obtained by subdividing a margin between two potential ranks rx and (rx+1).

First, the potential determination unit 14D respectively sets EffectU[wx][rx] and EffectL[wx][rx+1] to variables L and U effective in the process (step S2301). The variable L indicates the lowest potential in a margin between the potential ranks rx and (rx+1). The variable U indicates the lowest potential belonging to the potential rank (rx+1), and the potential directly below the variable U is the highest potential in the margin.

Then, the potential determination unit 14D compares the variables HitNumber [L] and [U−1] with each other (step S2303) as long as the relation of L<U is established (step S2302). If the HitNumber [L]<the HitNumber [U−1], "1" is subtracted from the variable U (step S2304). If the HitNumber [L]>the HitNumber [U−1], "1" is added to the variable L (step S2305). If the HitNumber [L]=the HitNumber [U−1], "1" is subtracted from the variable U and "1" is added to the variable L (step S2306).

If the relation of L<U is not established in step S2302, the potential determination unit 14D sets a value of the variable L to a neutral potential (step S2307). Then, the potential determination unit 14D sets read potential Vr to 0.15(V)*neutral potential, reads potentials of cells on a word line corresponding to wx, stores the result in the work register work0 (step S2308) and terminates the neutral potential estimation process.

[Effect of Third Embodiment]

FIG. 24(*a*) is a diagram for illustrating concrete example 1 of the variable HitNumber and FIG. 24(*b*) is a diagram for illustrating the way the variables L and U vary based on the variable HitNumber. FIG. 24(*a*) shows a margin between the potential ranks "1" and "2", the EffectU[wx][1] of the potential rank "1" is "10" and the EffectL[wx][2] of the potential rank "2" is "14". The variable HitNumber in concrete example 1 becomes larger as the potential becomes higher. For example, the variable HitNumber [11] is "1", the HitNumber [12] is "100" and the HitNumber [13] is "1000". The potential drop of the cell from the potential rank "2" is significant in the word line.

The variable U is gradually reduced as the number of comparison operations in step S2303 increases and the condition of termination is established, that is, the relation of L<U is not established when the variables HitNumber [11] are compared with each other. Therefore, a portion between the variables HitNumber [11] and [12] is determined as a boundary between the potential ranks "1" and "2", and "12" is set as the neutral potential in step S2307.

FIG. 25(*a*) is a diagram for illustrating concrete example 2 of the variable HitNumber and FIG. 25(*b*) is a diagram for illustrating the way the variables L and U vary based on the variable HitNumber. Like FIG. 24(*a*), FIG. 25(*a*) shows a margin between the potential ranks "1" and "2", that the EffectU[wx][1] of the potential rank "1" is "10" and that the EffectL[wx][2] of the potential rank "2" is "14". The variable HitNumber of concrete example 2 becomes larger as the potential becomes lower. Specifically, the variable HitNumber [11] is "1000", the HitNumber [12] is "100" and the HitNumber [13] is "1". The potential rise of the cell from the potential rank "1" is significant in the word line.

The variable L gradually increases as the number of comparison operations in step S2303 increases and the condition of termination is established, that is, the relation of L<U is not established when the variables HitNumber [14] are compared with each other. Therefore, a portion between the variables HitNumber [13] and [14] is determined as a boundary between the potential ranks "1" and "2", and "14" is set as the neutral potential in step S2307.

Thus, according to this embodiment, the neutral potential becomes low when the potential drop is significant and the neutral potential becomes high when the potential rise is significant. As a result, a more desirable neutral potential can be obtained according to the distribution of hit number.

In each of the above embodiments, a case wherein the NAND flash memory is used as the flash memory is explained, but this invention can be further widely applied to a nonvolatile semiconductor memory such as a NOR, AND or divided bit-line NOR (DINOR) memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system comprising:
    a cell array including a plurality of nonvolatile memory cells electrically connected to a common word line, each memory cell storing a plurality of bits represented by a plurality of potential ranks, and
    a controller configured to measure potentials of memory cells for each potential rank and to calculate a margin between adjacent potential ranks, wherein
    the controller is configured:
    when the calculation margin is smaller than a threshold, to change a lower limit and an upper limit of a potential rank; and
    when the calculated margin is equal to or larger than the threshold, not to change the lower limit and upper limit of the potential rank.

2. The system according to claim 1, wherein the controller determines the lower limit and the upper limit in programming.

3. The system according to claim 1, wherein the controller clears the lower limit and upper limit in erasing.

4. The system according to claim 1, wherein a lower limit of a first potential rank is a potential obtained by adding a constant margin to an upper limit of a second potential rank lower than the first potential rank by one potential rank.

5. The system according to claim 1, wherein an upper limit of a first potential rank is determined based on a maximum potential of first memory cells belonging to the first potential rank after data is programmed to the first memory cells.

6. The system according to claim 1, further comprising a determination unit configured to check whether a memory cell is present between a first potential rank and a second potential rank higher by one potential rank, and to determine a neutral potential used to separate the first and second potential ranks when the memory cell is present between the first and second potential ranks.

7. The system according to claim 6, wherein
    the determination unit is configured to change an upper limit of the first potential rank to cause a memory cell whose potential does not reach the neutral potential to belong to the first potential rank,
    the controller includes a program unit configured to reprogram a memory cell whose potential is not lower than the neutral potential to belong to the second potential rank, and the lower limit of the second potential rank is a potential obtained by adding a constant margin to the upper limit of the first potential rank.

8. The system according to claim 1, wherein the controller is configured to check a hit number of memory cells present between a first potential rank and a second potential rank higher by one potential rank for respective potential levels, and to calculate the margin based on a number of successive potential levels at which a hit number of the memory cells is "0".

9. The system according to claim 6, wherein the neutral potential is an intermediate potential between an upper limit of the first potential rank and a lower limit of the second potential rank.

10. The system according to claim 6, wherein the determination unit is configured to check a hit number of memory cells present between the first and second potential ranks for respective potential levels, and to acquire the neutral potential by repeatedly performing operations of comparing a hit number of a highest potential level with a hit number of a lowest potential level and incorporating the potential level larger in a hit number into one of lower and upper potential ranks.

11. The system according to claim 1, wherein a lower limit and an upper limit of a potential rank are set for each word line.

12. A control method of a memory system that includes a cell array including a plurality of nonvolatile memory cells electrically connected to a common word line, each memory cell storing a plurality of bits represented by a plurality of potential ranks, the method comprising:
  measuring potentials of memory cells for each potential rank,
  calculating a margin between adjacent potential ranks;
  when the calculated margin is smaller than a threshold, changing a lower limit and an upper limit of a potential rank; and
  when the calculated margin is equal to or larger than the threshold, not changing the lower limit and upper limit of the potential rank.

13. The method according to claim 12, wherein the lower limit and upper limit are determined in programming.

14. The method according to claim 12, wherein the lower limit and upper limit are cleared in erasing.

15. The method according to claim 12, wherein a lower limit of a first potential rank is a potential obtained by adding a constant margin to an upper limit of a second potential rank lower than the first potential rank by one potential rank.

16. The method according to claim 12, wherein an upper limit of a first potential rank is determined based on a maximum potential of first memory cells belonging to the first potential rank after data is programmed to the first memory cells.

17. The method according to claim 12, further comprising:
  checking whether a memory cell is present between a first potential rank and a second potential rank higher by one potential rank; and
  determining a neutral potential used to separate the first and second potential ranks when the memory cell is present between the first and second potential ranks.

18. The method according to claim 17, further comprising:
  changing an upper limit of the first potential rank to cause a memory cell whose potential does not reach the neutral potential to belong to the first potential rank; and
  reprogramming a memory cell whose potential is not lower than the neutral potential to belong to the second potential rank,
  wherein a lower limit of the second potential rank is a potential obtained by adding a constant margin to the upper limit of the first potential rank.

19. The method according to claim 12, further comprising:
  checking a hit number of memory cells present between a first potential rank and a second potential rank higher by one potential rank for respective potential levels; and
  calculating the margin based on the number of successive potential levels at which a hit number of memory cells is "0".

* * * * *